United States Patent
Aoki et al.

(10) Patent No.: US 9,473,714 B2
(45) Date of Patent: Oct. 18, 2016

(54) SOLID-STATE IMAGING DEVICE AND SEMICONDUCTOR DISPLAY DEVICE

(75) Inventors: Takeshi Aoki, Atsugi (JP); Hikaru Tamura, Zama (JP); Takayuki Ikeda, Atsugi (JP); Yoshiyuki Kurokawa, Sagamihara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 1040 days.

(21) Appl. No.: 13/170,631

(22) Filed: Jun. 28, 2011

(65) Prior Publication Data

US 2012/0002090 A1 Jan. 5, 2012

(30) Foreign Application Priority Data

Jul. 1, 2010 (JP) ................................ 2010-150844

(51) Int. Cl.
*H04N 5/353* (2011.01)
*G09G 3/34* (2006.01)
(Continued)

(52) U.S. Cl.
CPC ............ *H04N 5/353* (2013.01); *G09G 3/3413* (2013.01); *G09G 3/3648* (2013.01); *H04N 5/3741* (2013.01); *G09G 2300/0876* (2013.01);
(Continued)

(58) Field of Classification Search
CPC .. H04N 5/353; H04N 5/3741; H04N 5/3696; H04N 5/3745; G09G 3/3413; G09G 3/3648; G09G 2300/0876; G09G 2300/0261; G09G 2310/0235; H01L 27/1225
USPC .......................... 348/294, 302–308, 207.99; 257/290–292, 431; 250/208.1, 214.1
See application file for complete search history.

(56) References Cited

U.S. PATENT DOCUMENTS 5,386,108 A * 1/1995 Arikawa et al. ........... 250/208.1
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
(Continued)

*Primary Examiner* — Mekonnen Dagnew
(74) *Attorney, Agent, or Firm* — Robinson Intellectual Property Law Office; Eric J. Robinson

(57) ABSTRACT

An object is to provide a solid-state imaging device or a semiconductor display device with which a high-quality image can be taken. By performing operation using a global shutter method, a potential for controlling charge accumulation operation can be shared by all pixels. In addition, a first photosensor group includes a plurality of photosensors connected to a wiring supplied with an output signal, and a second photosensor group includes a plurality of photosensors connected to another wiring supplied with the output signal. A wiring for supplying a potential or a signal for controlling charge accumulation operation to the first photosensor group is connected to a wiring for supplying the potential or signal to the second photosensor group.

19 Claims, 20 Drawing Sheets

(51) Int. Cl.
*G09G 3/36* (2006.01)
*H04N 5/374* (2011.01)
*H01L 27/12* (2006.01)
*H04N 5/369* (2011.01)
*H04N 5/3745* (2011.01)

(52) U.S. Cl.
CPC ......... *G09G2310/0235* (2013.01); *G09G 2320/0261* (2013.01); *H01L 27/1225* (2013.01); *H04N 5/3696* (2013.01); *H04N 5/3745* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,480,227 | B1 | 11/2002 | Yoneyama |
| 6,563,174 | B2 | 5/2003 | Kawasaki et al. |
| 6,727,522 | B1 | 4/2004 | Kawasaki et al. |
| 6,747,638 | B2 | 6/2004 | Yamazaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,271,835 | B2 | 9/2007 | Iizuka et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,525,523 | B2 | 4/2009 | Yamazaki et al. |
| 7,663,165 | B2 | 2/2010 | Mouli |
| 7,674,650 | B2 | 3/2010 | Akimoto et al. |
| 7,732,819 | B2 | 6/2010 | Akimoto et al. |
| 7,791,074 | B2 | 9/2010 | Iwasaki |
| 7,855,369 | B2 | 12/2010 | Takahashi |
| 7,935,582 | B2 | 5/2011 | Iwasaki |
| 7,939,358 | B2 | 5/2011 | Choi |
| 7,956,361 | B2 | 6/2011 | Iwasaki |
| 8,058,647 | B2 | 11/2011 | Kuwabara et al. |
| 8,154,024 | B2 | 4/2012 | Iwasaki |
| 8,298,858 | B2 | 10/2012 | Kuwabara et al. |
| 8,525,236 | B2 | 9/2013 | Choi |
| 8,547,753 | B2 * | 10/2013 | Takemura et al. ....... 365/185.23 |
| 8,748,887 | B2 | 6/2014 | Kuwabara et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2004/0234032 | A1 | 11/2004 | Nokita |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0157760 | A1 | 7/2006 | Hayashi et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0238634 | A1 * | 10/2006 | Yan ............................. 348/308 |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0018075 | A1 | 1/2007 | Cazaux et al. |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 * | 5/2007 | Akimoto ........... H01L 29/41733 257/61 |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0054319 | A1 | 3/2008 | Mouli |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166475 | A1 * | 7/2008 | Jeong et al. ............... 427/126.3 |
| 2008/0166834 | A1 | 7/2008 | Kim et al. |
| 2008/0180385 | A1 | 7/2008 | Yoshida et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0101948 | A1 | 4/2009 | Park et al. |
| 2009/0114910 | A1 | 5/2009 | Chang |
| 2009/0134336 | A1 | 5/2009 | Takahashi |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0153200 | A1 * | 6/2009 | Kawagishi ......... H03K 17/0822 327/108 |
| 2009/0212385 | A1 | 8/2009 | Ohkubo et al. |
| 2009/0278122 | A1 | 11/2009 | Hosono et al. |
| 2009/0280600 | A1 | 11/2009 | Hosono et al. |
| 2009/0289968 | A1 | 11/2009 | Yoshida |
| 2009/0295769 | A1 | 12/2009 | Yamazaki et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0117991 | A1 | 5/2010 | Koyama et al. |
| 2010/0133525 | A1 * | 6/2010 | Arai et al. ..................... 257/40 |
| 2010/0182282 | A1 | 7/2010 | Kurokawa et al. |
| 2014/0252348 | A1 | 9/2014 | Kuwabara et al. |

FOREIGN PATENT DOCUMENTS

| | | | |
|---|---|---|---|
| EP | 2339639 | A | 6/2011 |
| EP | 2816607 | A | 12/2014 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |

(56) References Cited

FOREIGN PATENT DOCUMENTS

| JP | 63-239117 A | 10/1988 |
|---|---|---|
| JP | 63-265818 A | 11/1988 |
| JP | 05-251705 A | 9/1993 |
| JP | 08-264794 A | 10/1996 |
| JP | 10-285472 A | 10/1998 |
| JP | 11-505377 | 5/1999 |
| JP | 2000-044236 A | 2/2000 |
| JP | 2000-150900 A | 5/2000 |
| JP | 2001-045378 A | 2/2001 |
| JP | 2001-292276 A | 10/2001 |
| JP | 2002-076356 A | 3/2002 |
| JP | 2002-246580 A | 8/2002 |
| JP | 2002-289859 A | 10/2002 |
| JP | 2003-017677 A | 1/2003 |
| JP | 2003-086000 A | 3/2003 |
| JP | 2003-086808 A | 3/2003 |
| JP | 2004-103957 A | 4/2004 |
| JP | 2004-111590 A | 4/2004 |
| JP | 2004-273614 A | 9/2004 |
| JP | 2004-273732 A | 9/2004 |
| JP | 2004-344249 A | 12/2004 |
| JP | 2006-165527 A | 6/2006 |
| JP | 2006-191236 A | 7/2006 |
| JP | 2007-103918 A | 4/2007 |
| JP | 2009-130209 A | 6/2009 |
| JP | 2009-141717 A | 6/2009 |
| JP | 2009-218218 A | 9/2009 |
| JP | 4325557 | 9/2009 |
| JP | 2009-535819 | 10/2009 |
| JP | 4403687 | 1/2010 |
| JP | 2010-050146 A | 3/2010 |
| JP | 2010-141304 A | 6/2010 |
| TW | 200903786 | 1/2009 |
| WO | 2004/114391 | 12/2004 |
| WO | WO-2007/029844 | 3/2007 |
| WO | WO-2008/027392 | 3/2008 |

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds In$MO_3$(ZnO)m (M=In,Ga; m=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9th International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

(56) References Cited

OTHER PUBLICATIONS

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.
Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Sakata et al., "Development of 4.0-In. AMOLED Display with Driver Circuit Using Amorphous In—Ga—Zn—Oxide TFTs," IDW '09: Proceedings of the 16$^{th}$ International Display Workshops, 2009, pp. 689-692.
Park et al., "Amorphous Indium—Gallium—Zinc Oxide TFTs and their Application for Large Size AMOLED," AM-FPD '08 Digest of Technical Papers, Jul. 2, 2008, pp. 275-278.
Park et al., "Challenge to Future Displays: Transparent AM-OLED Driven by PEALD Grown ZnO TFT," IMID '07 Digest, 2007, pp. 1249-1252.
Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Osada et al., "Development of Driver-Integrated Panel using Amorphous In—Ga—Zn—Oxide TFT," AM-FPD '09 Digest of Technical Papers, Jul. 1, 2009, pp. 33-36.
Hirao et al., "Novel Top-Gate Zinc Oxide Thin-Film Transistors (ZnO TFTs) for AMLCDs," Journal of the SID, 2007, vol. 15, No. 1, pp. 17-22.
Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.
Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.
Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.
Miyasaka, "Suftla Flexible Microelectronics on their Way to Business," SID Digest '07: SID International Symposium Digest of Technical Papers, 2007, vol. 38, pp. 1673-1676.
Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.
Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.
Lee et al., "Current Status of, Challenges to, and Perspective View of AM-OLED," IDW '06: Proceedings of the 13$^{th}$ International Display Workshops, Dec. 7, 2006, pp. 663-666.
Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Nakamura, "Synthesis of Homologous Compound with New Long-Period Structure," NIRIM Newsletter, Mar. 1, 1995, vol. 150, pp. 1-4.
Kikuchi et al., "Polymer-Stabilized Liquid Crystal Blue Phases," Nature Materials, Sep. 2, 2002, vol. 1, pp. 64-68.
Kimizuka et al., "Spinel, YbFe2O4, and Yb2Fe3O7 Types of Structures for Compounds in the In2O3 and Sc2O3—A2O3—BO Systems [A: Fe, Ga, or Al; B: Mg, Mn, Fe, Ni, Cu, or Zn] at Temperatures Over 1000° C." Journal of Solid State Chemistry, 1985, vol. 60, pp. 382-384.
Kitzerow et al., "Observation of Blue Phases in Chiral Networks," Liquid Crystals, 1993, vol. 14, No. 3, pp. 911-916.
Costello et al., "Electron Microscopy of a Cholesteric Liquid Crystal and its Blue Phase," Phys. Rev. A (Physical Review A), May 1, 1984, vol. 29, No. 5, pp. 2957-2959.
Meiboom et al., "Theory of the Blue Phase of Cholesteric Liquid Crystals," Phys. Rev. Lett. (Physical Review Letters), May 4, 1981, vol. 46, No. 18, pp. 1216-1219.
Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.
Orita et al., "Mechanism of Electrical Conductivity of Transparent InGaZnO$_4$," Phys. Rev. B (Physical Review B), Jan. 15, 2000, vol. 61, No. 3, pp. 1811-1816.
Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Janotti et al., "Native Point Defects in ZnO," Phys. Rev. B (Physical Review B), Oct. 4, 2007, vol. 76, No. 16, pp. 165202-1-165202-22.
Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.
Janotti et al., "Oxygen Vacancies in ZnO," Appl. Phys. Lett. (Applied Physics Letters), 2005, vol. 87, pp. 122102-1-122102-3.
Oba et al., "Defect energetics in ZnO: A hybrid Hartree-Fock density functional study," Phys. Rev. B (Physical Review B), 2008, vol. 77, pp. 245202-1-245202-6.
Orita et al., "Amorphous transparent conductive oxide InGaO3(ZnO)m (m<4): a Zn4s conductor," Philosophical Magazine, 2001, vol. 81, No. 5, pp. 501-515.
Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Mo et al., "Amorphous Oxide TFT Backplanes for Large Size AMOLED Displays," IDW '08: Proceedings of the 6$^{th}$ International Display Workshops, Dec. 3, 2008, pp. 581-584.
Kim et al., "High-Performance oxide thin film transistors passivated by various gas plasmas," 214$^{th}$ ECS Meeting, 2008, No. 2317.
Clark et al., "First Principles Methods Using CASTEP," Zeitschrift fur Kristallographie, 2005, vol. 220, pp. 567-570.
Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.
Ueno et al., "Field-Effect Transistor on SrTiO$_3$ with Sputtered Al$_2$O$_3$ Gate Insulator," Appl. Phys. Lett. (Applied Physics Letters), Sep. 1, 2003, vol. 83, No. 9, pp. 1755-1757.
Jeon et al. "180 nm Gate Length Amorphous InGaZnO Thin Film Transistor for High Density Image Sensor Applications," IEDM 10: Technical Digest of International Electron Devices Meeting, Dec. 6, 2010, pp. 504-507.
International Search Report (Application No. PCT/JP2011/054211) dated Mar. 29, 2011.
Written Opinion (Application No. PCT/JP2011/054211) dated Mar. 29, 2011.
Taiwanese Office Action (Application No. 100123096) Dated May 28, 2015.
Taiwanese Office Action (Application No. 104142265) Dated Aug. 12, 2016.

\* cited by examiner

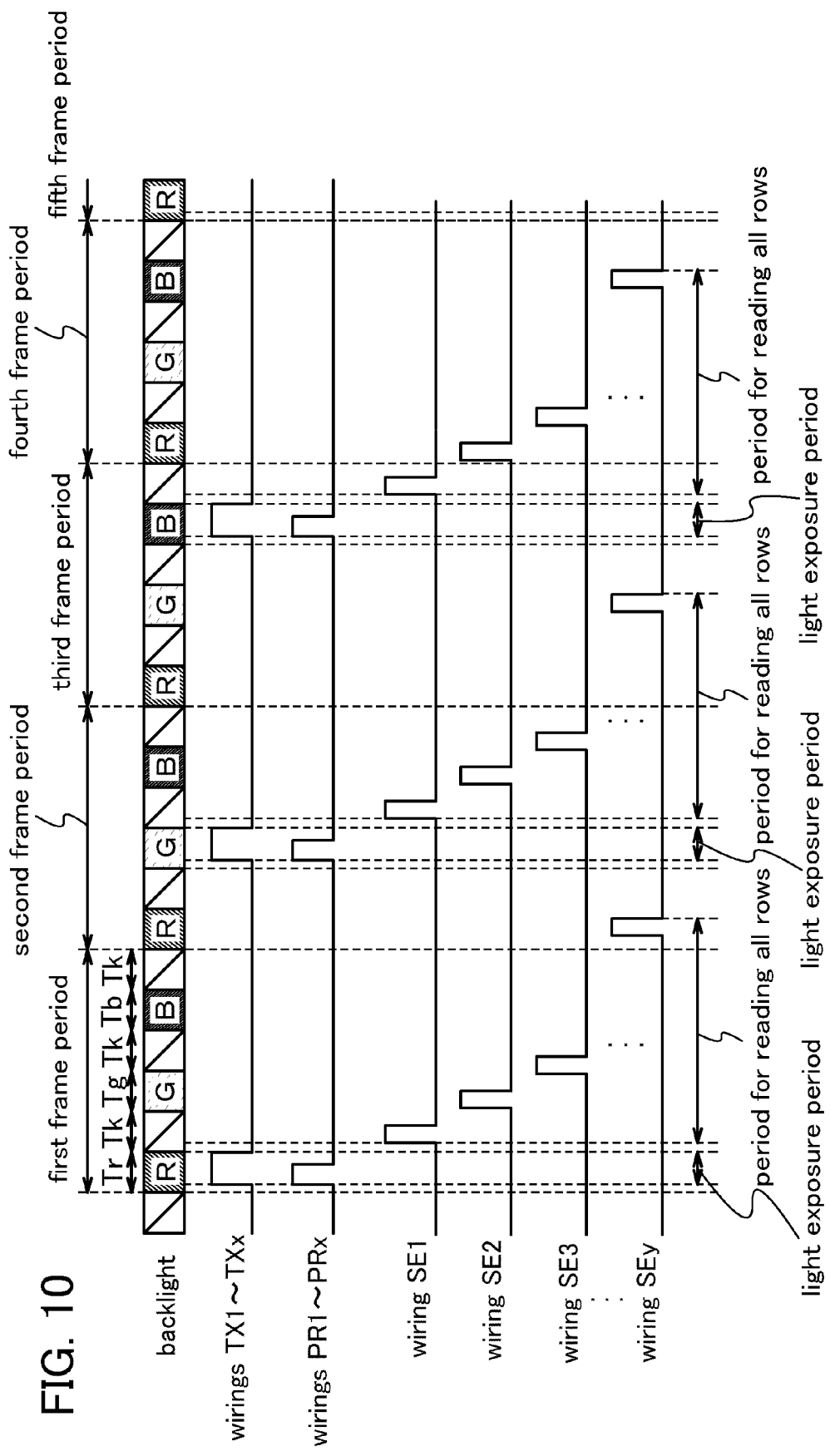

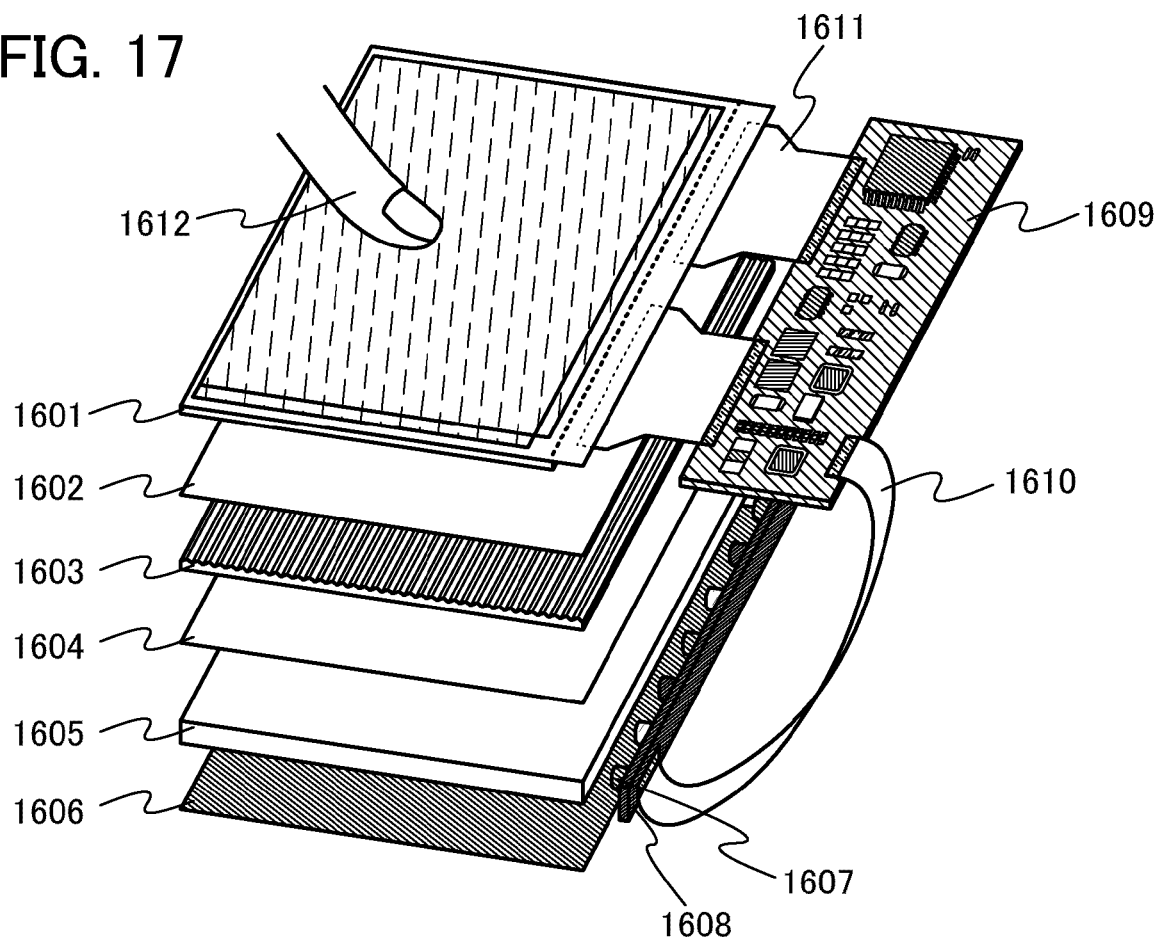

SOLID-STATE IMAGING DEVICE AND SEMICONDUCTOR DISPLAY DEVICE

BACKGROUND OF THE INVENTION

1. Field of the Invention

An embodiment of the present invention relates to a solid-state imaging device including a photosensor in a pixel, and to a semiconductor display device including a photosensor and a display element in a pixel.

2. Description of the Related Art

A photosensor utilizing an amplifying function of a MOS transistor, called a CMOS sensor, can be manufactured by a general CMOS process. Thus, manufacturing cost of a solid-state imaging device including a CMOS sensor in each pixel can be low, and a semiconductor display device having a photosensor and a display element formed over one substrate can be realized. In addition, a CMOS sensor requires lower driving voltage than a CCD sensor; therefore, power consumption of the solid-state imaging device can be suppressed.

For a solid-state imaging device or a semiconductor display device including a CMOS sensor, a rolling shutter method is generally employed in which an operation to accumulate charge in a photodiode and an operation to read the charge are sequentially performed row by row. However, in taking an image by a rolling shutter method, a period for performing accumulation operation in the first row differs from that in the last row. Thus, when an image of a fast-moving object is taken by a rolling shutter method, image data of the object with distortion is produced.

Patent Document 1 given below discloses a technique for correcting distortion of image data which occurs when an image is taken with a CMOS sensor by a rolling shutter method.

REFERENCE

[Patent Document 1] Japanese Published Patent Application No. 2009-141717

SUMMARY OF THE INVENTION

In a solid-state imaging device or a semiconductor display device including a CMOS sensor, a wiring for supplying a power supply potential or a signal potential to a photosensor is provided in a pixel portion. Since this wiring has resistance, a pixel which is farther from a source of a power supply potential or a source of a signal is likely to have a larger decrease in potential. In addition, a wiring having higher resistance or a contact portion or the like having higher parasitic capacitance is more likely to cause a signal delay. When a potential decrease or a signal delay along the wiring occurs, the power supply potential or the signal potential to be supplied to photosensors varies within the pixel portion, and the potential variation is reflected in the potential of a signal to be output from the photosensors and reduces the quality of an image to be taken.

In order to resolve distortion in image data due to a rolling shutter method, a global shutter method which is employed for a solid-state imaging device including a CCD sensor is preferably used for a solid-state imaging device or a semiconductor display device including a CMOS sensor. A global shutter method is that in which all pixels perform accumulation operation simultaneously. By employing the global shutter method, distortion in image data can be resolved. However, since all pixels perform accumulation operation simultaneously in the case of the global shutter method, potential decrease or signal delay along a wiring as stated above is highly likely to occur, depending on the current or voltage supply capability of a driver circuit.

Low power consumption is one of the important points in terms of evaluating performance of a solid-state imaging device or a semiconductor display device. In particular, in a portable electronic device such as a mobile phone, a solid-state imaging device or a semiconductor display device is required to consume less power because high power consumption thereof leads to a disadvantage of short continuous operation time.

In view of the above problems, it is an object of one embodiment of the present invention to provide a solid-state imaging device or a semiconductor display device with which a high-quality image can be taken. It is another object of one embodiment of the present invention to provide a solid-state imaging device or a semiconductor display device which consumes less power.

In the case of taking an image by a global shutter method, charge accumulation operation is performed by all pixels simultaneously. Therefore, a potential for controlling the charge accumulation operation, such as a potential supplied to a photodiode or a potential of a signal for controlling the switching of a transistor for holding charge, can be shared by all the pixels. Thus, in a solid-state imaging device or a semiconductor display device according to one embodiment of the present invention, a first photosensor group includes a plurality of photosensors connected to a wiring supplied with an output signal, and a second photosensor group includes a plurality of photosensors connected to another wiring supplied with the output signal. A wiring for supplying a potential for controlling charge accumulation operation to the first photosensor group is connected to a wiring for supplying the potential to the second photosensor group. The above configuration suppresses a potential decrease or a signal delay due to wiring resistance and prevents variation in a potential or a signal for controlling charge accumulation operation within a pixel portion, which are highly likely to occur in the case of a global shutter method.

The solid-state imaging device or the semiconductor display device according to one embodiment of the present invention may include, in a backlight, a plurality of light sources which emit light of different colors and may perform field sequential operation (FS operation) in which the light sources are sequentially turned on. In that case, image data corresponding to each color can be obtained at each pixel, by performing charge accumulation operation in a period when the light source of the corresponding color is turned on. Then, color image data can be obtained by combining the image data corresponding to the colors. The semiconductor display device can perform FS operation not only at the time of taking an image but also at the time of displaying an image. Specifically, the semiconductor display device can display a color image by sequentially turning on the light sources corresponding to colors and displaying grayscale levels corresponding to the colors in periods when the individual light sources corresponding to the colors are turned on. In that case, an element whose transmittance is controlled by a video signal, such as a liquid crystal element, is used as a display element.

The adoption of FS operation eliminates the need to provide a color filter in each pixel and can increase use efficiency of light from a backlight. With a single pixel, image data corresponding to different colors can be obtained, or grayscale levels corresponding to different colors can be displayed; thus, high-resolution image data can be obtained, or a high-definition image can be displayed.

In the case of FS operation of the backlight, light sources of different colors need to be sequentially turned on one after another so as to emit light, unlike in the case of combining a light source of a single color with color filters. In addition, the frequency at which each light source is switched to another needs to be set higher than the frame frequency in the case of using a light source of a single color. For example, when the frame frequency in the case of using a light source of a single color is 60 Hz, the frequency at which each light source is switched to another in the case of performing FS operation using light sources corresponding to colors of red, green, and blue is approximately 180 Hz which is about three times as high as the frame frequency. Thus, a period when the light source of each color emits light is very short. On the other hand, in one embodiment of the present invention, an image is taken by a global shutter method; thus, charge accumulation operation is performed by all pixels simultaneously. Accordingly, it can take less time for all pixels to complete accumulation operation, as compared to the case of using a rolling shutter method. Therefore, even in the case where a period when the light source of each color emits light is made short by employing FS operation, accumulation operation can be completed by all pixels within the above period.

Note that in the case of employing a global shutter method for a solid-state imaging device or a semiconductor display device including a CMOS sensor, reading operation needs to be sequentially performed row by row after all pixels perform accumulation operation simultaneously. Thus, a charge holding period between the end of accumulation operation and the start of reading operation differs among rows. Therefore, if charge leakage due to off-state current of a transistor occurs, the amount of charge accumulated in each row changes according to the length of the above period. Thus, image data of an object with an altered grayscale may be produced.

Thus, in a solid-state imaging device or a semiconductor display device according to one embodiment of the present invention, an insulated-gate field-effect transistor (hereinafter simply referred to as a transistor) with significantly small off-state current may be used as a switching element for holding charge that is accumulated in a photosensor. The transistor includes, in a channel formation region, a semiconductor material whose band gap is wider than a silicon semiconductor and whose intrinsic carrier density is lower than that of silicon. With a channel formation region including a semiconductor material having the above-described characteristics, a transistor with significantly small off-state current and high withstand voltage can be realized. As an example of such a semiconductor material, an oxide semiconductor having a band gap which is approximately three times as wide as that of silicon can be given. With the use of the transistor having the above structure as a switching element, charge leakage in a charge holding period can be suppressed, and in the case of using a global shutter method, a change in grayscale due to a difference in charge holding period among rows can be suppressed.

Note that a purified oxide semiconductor (purified OS) obtained by reduction of impurities such as moisture or hydrogen which serves as an electron donor (donor) and by reduction of oxygen defects is an intrinsic (i-type) semiconductor or a substantially i-type semiconductor. Therefore, a transistor including the oxide semiconductor has a characteristic of significantly small off-state current. Specifically, the concentration of hydrogen in the purified oxide semiconductor which is measured by secondary ion mass spectrometry (SIMS) is less than or equal to $5\times10^{19}/cm^3$, preferably less than or equal to $5\times10^{18}/cm^3$, further preferably less than or equal to $5\times10^{17}/cm^3$, still further preferably less than or equal to $1\times10^{16}/cm^3$. The carrier density of an oxide semiconductor film, which can be measured by Hall effect measurement, is less than $1\times10^{14}/cm^3$, less than $1\times10^{12}/cm^3$, or less than $1\times10^{11}/cm^3$. The band gap of the oxide semiconductor is 2 eV or more, preferably 2.5 eV or more, or further preferably 3 eV or more. With the use of the oxide semiconductor film which is purified by sufficiently reducing the concentration of impurities such as moisture or hydrogen and by reducing oxygen defects, off-state current of the transistor can be reduced.

The analysis of the concentration of hydrogen in an oxide semiconductor film is described here. The concentrations of hydrogen in the oxide semiconductor film and a conductive film are measured by SIMS. Because of the principle of SIMS, it is known that accurate data in the proximity of a surface of a sample or in the proximity of an interface between stacked films formed of different materials is difficult to obtain. Thus, in the case where the distribution of the hydrogen concentration in the thickness direction of a film is analyzed by SIMS, the average value of the hydrogen concentration in a region of the film where substantially the same value can be obtained without significant variation is employed as the hydrogen concentration. Further, in the case where the thickness of the film to be measured is small, a region where substantially the same value can be obtained cannot be found in some cases due to the influence of the hydrogen concentration of an adjacent film. In this case, the maximum value or the minimum value of the hydrogen concentration of a region where the film is provided is employed as the hydrogen concentration of the film. Furthermore, in the case where a mountain-shaped peak having the maximum value and a valley-shaped peak having the minimum value do not exist in the region where the films are provided, the value of the inflection point is employed as the hydrogen concentration.

Various experiments can actually prove small off-state current of the transistor including the purified oxide semiconductor film as an active layer. For example, even with an element with a channel width of $1\times10^6$ μm and a channel length of 10 μm, in a range of from 1 V to 10 V of voltage (drain voltage) between a source electrode and a drain electrode, it is possible that off-state current (which is drain current in the case where voltage between a gate electrode and the source electrode is 0 V or less) is less than or equal to the measurement limit of a semiconductor parameter analyzer, that is, less than or equal to $1\times10^{-13}$ A. In that case, it can be found that an off-state current density corresponding to a value obtained by dividing the off-state current by the channel width of the transistor is less than or equal to 100 zA/μm. Further, an off-state current density has been measured with the use of a circuit in which a capacitor and a transistor are connected to each other and charge that flows into the capacitor or flows out of the capacitor is controlled by the transistor. In the measurement, a purified oxide semiconductor film has been used for a channel formation region of the transistor, and an off-state current density of the transistor has been measured from a change in the amount of charge of the capacitor per unit time. As a result, it is found that, in the case where the voltage between the source electrode and the drain electrode of the transistor is 3 V, a smaller off-state current density of several tens of yA/μm is obtained. Thus, in a semiconductor device according to one embodiment of the present invention, the off-state current density of a transistor in which a purified oxide semiconductor film is used as an active layer can be set to less than or equal to 100 yA/μm, preferably less than or equal to 10 yA/μm, further preferably less than or equal to 1 yA/μm depending on the voltage between a source electrode and a drain electrode. Accordingly, the off-state current of the transistor in which the purified oxide semiconductor film is used as an active layer is considerably smaller than that of a transistor in which silicon having crystallinity is used.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. Note that, for example, an In—Ga—Zn-based oxide means an oxide containing In, Ga, and Zn, and there is no limitation on the ratio of In:Ga:Zn. A metal element in addition to In, Ga, and Zn may be included. The oxide semiconductor may contain silicon.

The oxide semiconductor may be expressed by $InMO_3(ZnO)_m$ (m>0, m is not necessarily a natural number). Here, M represents one or more metal elements selected from Ga, Fe, Mn, and Co. As the oxide semiconductor, a material represented by $In_2SnO_5(ZnO)_n$ (n>0, n is an integer) may be used.

In one embodiment of the present invention, among wirings for supplying a potential to pixels provided in rows or columns, at least two of a plurality of wirings for supplying a potential to a photodiode, or at least two of a plurality of wirings for supplying a potential of a signal for controlling the switching of the transistor with significantly small off-state current are electrically connected to each other. The above structure can suppress a potential decrease or a signal delay due to wiring resistance and can prevent the above potential or the potential of the signal from varying within a pixel portion. As a result, it is possible to prevent variation in the potential of signals to be output from photosensors, and it is possible to take a high-quality image.

In one embodiment of the present invention, a global shutter method is employed, so that the above structure can be combined with FS operation. The adoption of FS operation can reduce power consumption of a solid-state imaging device or a semiconductor display device.

In one embodiment of the present invention, a transistor with significantly small off-state current is used as a switching element for holding charge that is accumulated in a photosensor; accordingly, it is possible to suppress a gray-scale change due to a difference in charge holding period and to take a high-quality image, even when the image is taken by a global shutter method.

BRIEF DESCRIPTION OF THE DRAWINGS

FIG. 10 is a diagram illustrating a lighting period and a non-lighting period of a light source and changes in potentials of a wiring TX, a wiring PR, and a wiring SE over time.

FIG. 17 is a perspective view illustrating a structure of a semiconductor display device.

DETAILED DESCRIPTION OF THE INVENTION

Embodiments of the present invention will be described below in detail with reference to the drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments.

(Embodiment 1)

A configuration of connections among photosensors included in a solid-state imaging device or a semiconductor display device of one embodiment of the present invention will be described with reference to FIG. 1.

Figure 1:
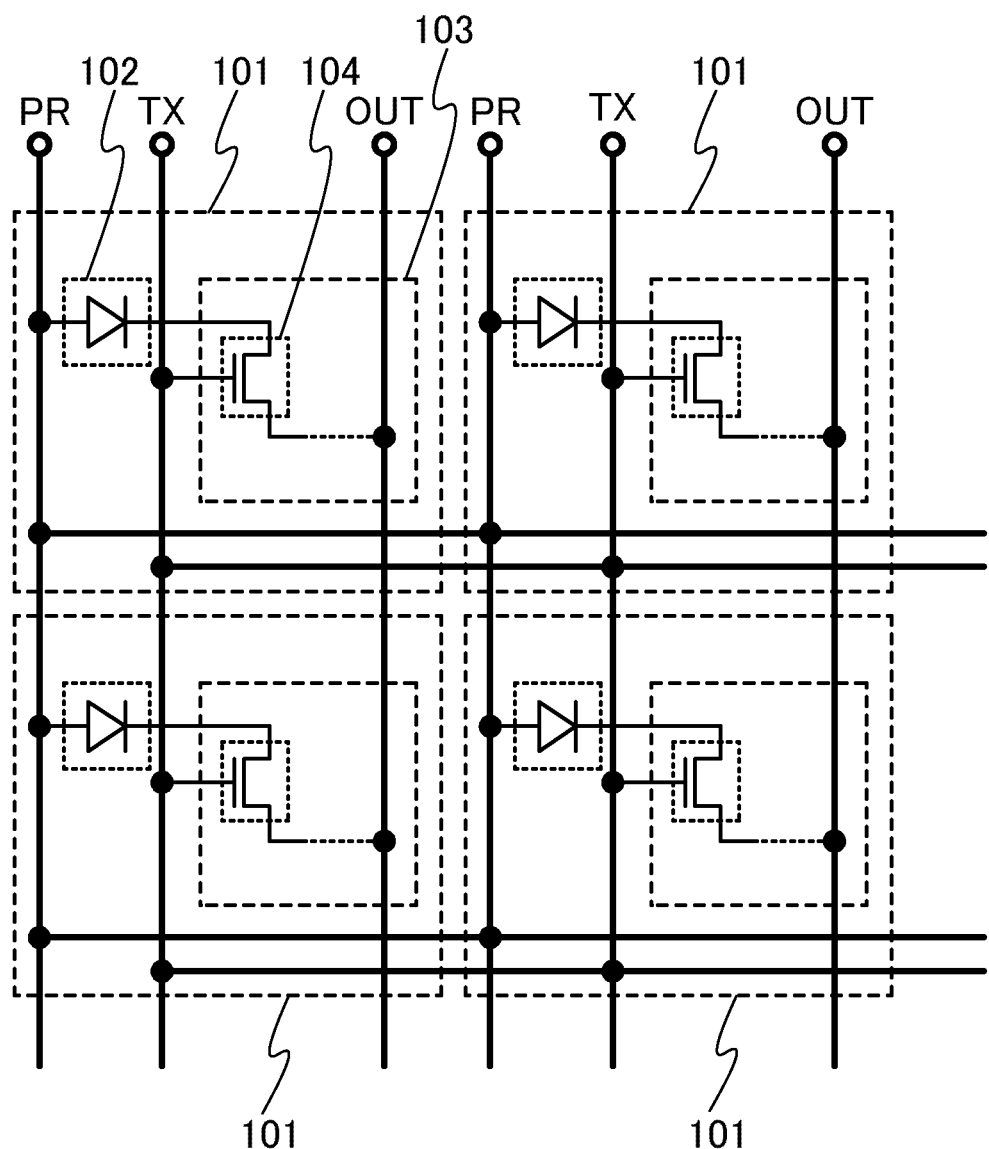
FIG. 1 is a circuit diagram illustrating a configuration of connections among a plurality of photosensors.

FIG. 1 is an example of a circuit diagram illustrating a configuration of connections among a plurality of photosensors 101 in a pixel portion. In FIG. 1, the photosensors 101 included in pixels are arranged in matrix. Each of the photosensors 101 includes a photodiode 102 and an amplifier circuit 103. The photodiode 102 is a photoelectric conversion element which generates current when a junction of semiconductors is irradiated with light. The amplifier circuit 103 is a circuit which amplifies current obtained through light reception by the photodiode 102 or which holds charge accumulated due to the current.

The amplifier circuit 103 may have any configuration as long as it can amplify current generated in the photodiode 102; the amplifier circuit 103 includes at least a transistor 104 which functions as a switching element. The switching element controls the supply of the current to the amplifier circuit 103.

In one embodiment of the present invention, a channel formation region of the transistor 104 which functions as a switching element may include a semiconductor whose band gap is wider than that of a silicon semiconductor and whose intrinsic carrier density is lower than that of silicon. As examples of the semiconductor, a compound semiconductor such as silicon carbide (SiC) or gallium nitride (GaN), an oxide semiconductor including a metal oxide such as zinc oxide (ZnO), and the like can be given. Among the above semiconductors, an oxide semiconductor has an advantage such as high mass productivity because an oxide semiconductor can be formed by a sputtering method, a wet process (e.g., a printing method), or the like. A compound semiconductor such as silicon carbide or gallium nitride is required to be a single crystal, and in order to obtain a single crystal material, crystal growth at a temperature significantly higher than a process temperature for the oxide semiconductor is needed or epitaxial growth over a special substrate is needed. On the other hand, an oxide semiconductor has high mass productivity because a film thereof can be formed even at room temperature and therefore the film can be formed over a silicon wafer that can be obtained easily or a glass substrate which is inexpensive and can be applied when the size of a substrate is increased. In addition, it is possible to stack a semiconductor element including an oxide semiconductor over an integrated circuit including a normal semiconductor material such as silicon or gallium. Accordingly, among the semiconductors with wide band gaps, the oxide semiconductor particularly has an advantage of high mass productivity. Further, in the case where a crystalline oxide semiconductor is to be obtained in order to improve the performance of a transistor (e.g., field-effect mobility), the crystalline oxide semiconductor can be easily obtained by heat treatment at 200° C. to 800° C.

In the following description, the case in which an oxide semiconductor having the above advantages is used as the semiconductor having a wide band gap is given as an example.

When a semiconductor material having the above-described characteristics is included in a channel formation region, the transistor 104 can have extremely small off-state current and high withstand voltage. Further, when the transistor 104 having the above-described structure is used as a switching element, leakage of charge accumulated in the amplifier circuit 103 can be prevented.

Note that it is preferable to use a semiconductor with a wide band gap such as an oxide semiconductor for an active layer of the transistor 104 because leakage of charge accumulated in the amplifier circuit 103 can be further prevented, but the present invention is not necessarily limited to this structure. It is possible to achieve operation by a global shutter method even when a semiconductor other than an oxide semiconductor, such as amorphous silicon, microcrystalline silicon, polycrystalline silicon, single crystal silicon, amorphous germanium, microcrystalline germanium, polycrystalline germanium, or single crystal germanium, is used for the active layer of the transistor 104.

Unless otherwise specified, in the case of an n-channel transistor, off-state current in this specification is a current which flows between a source electrode and a drain electrode when, in the state where the potential of the drain electrode is higher than that of the source electrode and that of a gate electrode, the potential of the gate electrode is less than or equal to zero with respect to the potential of the source electrode. Furthermore, in this specification, in the case of a p-channel transistor, off-state current is a current which flows between a source electrode and a drain electrode when, in the state where the potential of the drain electrode is lower than that of the source electrode or that of a gate electrode, the potential of the gate electrode is greater than or equal to zero with respect to the potential of the source electrode.

The names of the "source electrode" and the "drain electrode" included in the transistor interchange with each other depending on the polarity of the transistor or the difference between potentials applied to the respective electrodes. In general, in an n-channel transistor, an electrode to which a lower potential is applied is called a source electrode, and an electrode to which a higher potential is applied is called a drain electrode. Further, in a p-channel transistor, an electrode to which a lower potential is applied is called a drain electrode, and an electrode to which a higher potential is applied is called a source electrode. One of a source electrode and a drain electrode is referred to as a first terminal and the other is referred to as a second terminal, and the connection relationship between the photodiode 102 and the transistor 104 included in the photosensor 101 will be described below.

Specifically, in FIG. 1, an anode of the photodiode 102 is connected to a wiring PR. A cathode of the photodiode 102 is connected to a first terminal of the transistor 104. A second terminal of the transistor 104 is connected to another semiconductor element included in the amplifier circuit 103; thus, the connection of the second terminal of the transistor 104 differs depending on the configuration of the amplifier circuit 103. A gate electrode of the transistor 104 is connected to a wiring TX. The wiring TX is supplied with a potential of a signal for controlling the switching of the transistor 104. The photosensor 101 is connected to a wiring OUT. The wiring OUT is supplied with a potential of an output signal which is output from the amplifier circuit 103.

Note that the term "connection" in this specification refers to electrical connection and corresponds to the state in which current, voltage, or a potential can be supplied or transmitted. Accordingly, a connection state means not only a state of a direct connection but also a state of indirect connection through a circuit element such as a wiring, a resistor, a diode, or a transistor so that current, voltage, or a potential can be supplied or transmitted.

Even when a circuit diagram illustrates independent components which are connected to each other, there is a case where one conductive film has functions of a plurality of components such as the case where part of a wiring functions as an electrode. In this specification, the term "connection" also means a case where one conductive film has functions of a plurality of components.

Note that FIG. 1 illustrates as an example the case where the wiring PR, the wiring TX, and the wiring OUT are connected to each of the photosensors 101; however, the number of wirings included in each of the photosensors 101 in one embodiment of the present invention is not limited to the number in this example. In addition to the above wirings, a wiring supplied with a power supply potential, a wiring supplied with a potential of a signal for resetting the amount of charge held by the amplifier circuit 103, or the like may be connected to each of the photosensors 101.

In one embodiment of the present invention, as illustrated in FIG. 1, one wiring OUT is connected to a plurality of photosensors 101, and a plurality of photosensors 101 connected to one wiring OUT is not connected to another wiring OUT and is electrically isolated therefrom. In addition, in one embodiment of the present invention, a first photosensor group includes a plurality of photosensors 101 connected to one wiring OUT; a second photosensor group includes a plurality of photosensors 101 connected to another wiring OUT; and a wiring PR connected to the first photosensor group is connected to a wiring PR connected to the second photosensor group. In one embodiment of the present invention, a wiring TX connected to the first photosensor group is connected to a wiring TX connected to the second photosensor group.

In one embodiment of the present invention, the above configuration can suppress a potential decrease or a signal delay due to the resistance of the wirings PR or the wirings TX. As a result, it is possible to prevent a potential supplied to the anode of the photodiode 102 or a potential of a signal for controlling the switching of the transistor 104 for holding charge from varying within the pixel portion. Accordingly, it is possible to prevent a potential of a signal to be output from the photosensor 101 from varying, and it is possible to take a high-quality image.

Note that although FIG. 1 illustrates the configuration of the photosensor 101 in which the amplifier circuit 103 includes only one transistor 104 which functions as a switching element, the present invention is not limited to this configuration. Although the configuration in which one transistor functions as one switching element is described, a plurality of transistors may function as one switching element in one embodiment of the present invention. In the case where a plurality of transistors functions as one switching element, the plurality of transistors may be connected to each other in parallel, in series, or in combination of parallel connection and series connection.

In this specification, the state in which transistors are connected to each other in series, for example, means a state in which only one of a first terminal and a second terminal of a first transistor is connected to only one of a first terminal and a second terminal of a second transistor. Further, the state in which transistors are connected to each other in parallel means a state in which a first terminal of a first transistor is connected to a first terminal of a second transistor and a second terminal of the first transistor is connected to a second terminal of the second transistor.

FIG. 1 illustrates the case where the transistor 104 includes the gate electrode only on one side of the active layer. When the transistor 104 includes a pair of gate electrodes having the active layer sandwiched therebetween, one of the gate electrodes is supplied with a signal for controlling switching, and the other of the gate electrodes may be in a floating state (i.e., electrically isolated) or may be supplied with a potential. In the latter case, the pair of electrodes may be supplied with the same level of potential, or only the other of the gate electrodes may be supplied with a fixed potential such as a ground potential. By controlling the level of potential supplied to the other of the gate electrodes, the threshold voltage of the transistor 104 can be controlled.

Figure 2A:
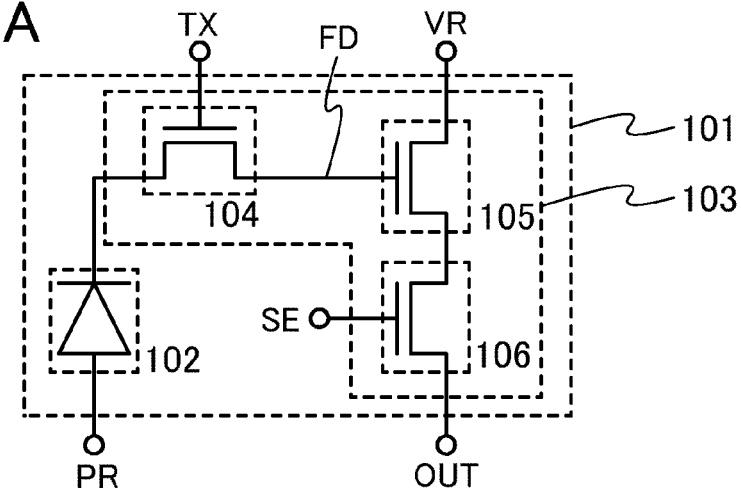
FIGS. 2A and 2B are a circuit diagram of a photosensor and a circuit diagram of a pixel portion.

Next, an example of a specific configuration of the photosensor 101 will be described. FIG. 2A is a circuit diagram of an example of the photosensor 101.

In the photosensor 101 illustrated in FIG. 2A, the amplifier circuit 103 includes a transistor 105 and a transistor 106 in addition to the transistor 104. In the transistor 105, the current value or resistance value between a first terminal and a second terminal thereof is determined by a potential supplied to the second terminal of the transistor 104. The transistor 106 functions as a switching element for supplying a potential of an output signal determined by the current value or resistance value, to the wiring OUT.

Specifically, in FIG. 2A, the second terminal of the transistor 104 is connected to a gate electrode of the transistor 105. The first terminal of the transistor 105 is connected to a wiring VR which is supplied with a high-level power supply potential VDD. The second terminal of the transistor 105 is connected to a first terminal of the transistor 106. A second terminal of the transistor 106 is connected to the wiring OUT. A gate electrode of the transistor 106 is connected to a wiring SE, and the wiring SE is supplied with a potential of a signal for controlling the switching of the transistor 106.

In FIG. 2A, a node where the second terminal of the transistor 104 and the gate electrode of the transistor 105 are connected to each other is denoted by a node FD. The current value or resistance value between the first terminal and the second terminal of the transistor 105 is determined by the amount of charge accumulated at the node FD. In addition to this, the potential of the output signal supplied from the second terminal of the transistor 106 is determined by a potential of a signal for controlling the switching of the transistor 106. In order to hold charge at the node FD more reliably, a storage capacitor may be connected to the node FD.

Note that in FIG. 2A, an oxide semiconductor film may be used for active layers of the transistor 105 and the transistor 106 included in the amplifier circuit 103, other than the transistor 104. Alternatively, a semiconductor other than an oxide semiconductor, such as amorphous silicon, microcrystalline silicon, polycrystalline silicon, single crystal silicon, amorphous germanium, microcrystalline germanium, polycrystalline germanium, or single crystal germanium, may be used for active layers of the transistor 104, the transistor 105, and the transistor 106. With the use of an oxide semiconductor film for active layers of all transistors in the photosensor 101, a manufacturing process can be simplified. With the use of a semiconductor material capable of providing higher mobility than an oxide semiconductor, such as polycrystalline or single crystal silicon, for active layers of the transistor 105 and the transistor 106, image data can be read from the photosensor 101 at high speed.

Figure 2B:
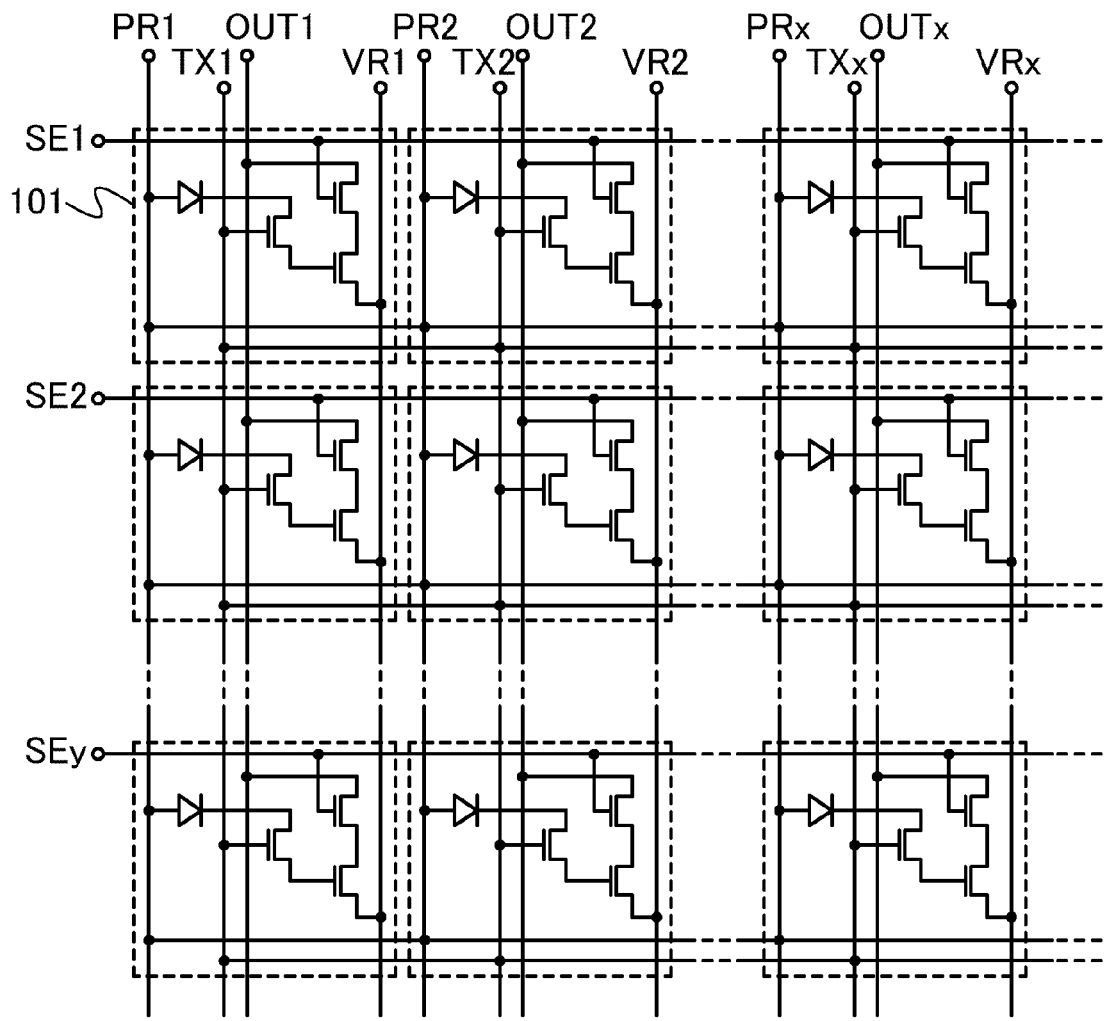

FIG. 2B illustrates an example of a configuration of a pixel portion including the photosensor 101 illustrated in FIG. 2A.

In FIG. 2B, a plurality of photosensors 101 is arranged in matrix. The photosensors 101 in each column are connected to one of a plurality of wirings PR (referred to as wirings PR1 to PRx), one of a plurality of wirings TX (referred to as wirings TX1 to TXx), one of a plurality of wirings OUT (referred to as wirings OUT1 to OUTx), and one of a plurality of wirings VR (referred to as wirings VR1 to VRx). The photosensors 101 in each row are connected to one of a plurality of wirings SE (referred to as wirings SE1 to SEy).

In FIG. 2B, a plurality of photosensors 101 connected to the wiring OUTi (i is one of 1 to x) and the wiring VR1 (i is one of 1 to x) is not connected to the wiring OUTj (j is one of 1 to x, but not i) and the wiring VRj (j is one of 1 to x, but not i) and is electrically isolated therefrom. In FIG. 2B, a first photosensor group includes the plurality of photosensors 101 connected to the wiring OUTi and the wiring VR1; a second photosensor group includes a plurality of photosensors 101 connected to the wiring OUTj and the wiring VRj; and the wiring PRi connected to the first photosensor group is connected to the wiring PRj connected to the second photosensor group. The wiring TXi connected to the first photosensor group is connected to the wiring TXj connected to the second photosensor group.

The above configuration can suppress a potential decrease or a signal delay due to the resistance of the wirings PR and the wirings TX, as in the case of FIG. 1. As a result, it is possible to prevent a potential supplied to the anode of the photodiode 102 or a potential of a signal for controlling the switching of the transistor 104 for holding charge from varying within the pixel portion. Accordingly, it is possible to prevent a potential of a signal to be output from the photosensor 101 from varying, and it is possible to take a high-quality image.

Next, an example of operation of the photosensors 101 illustrated in FIGS. 2A and 2B will be described.

Figure 3:
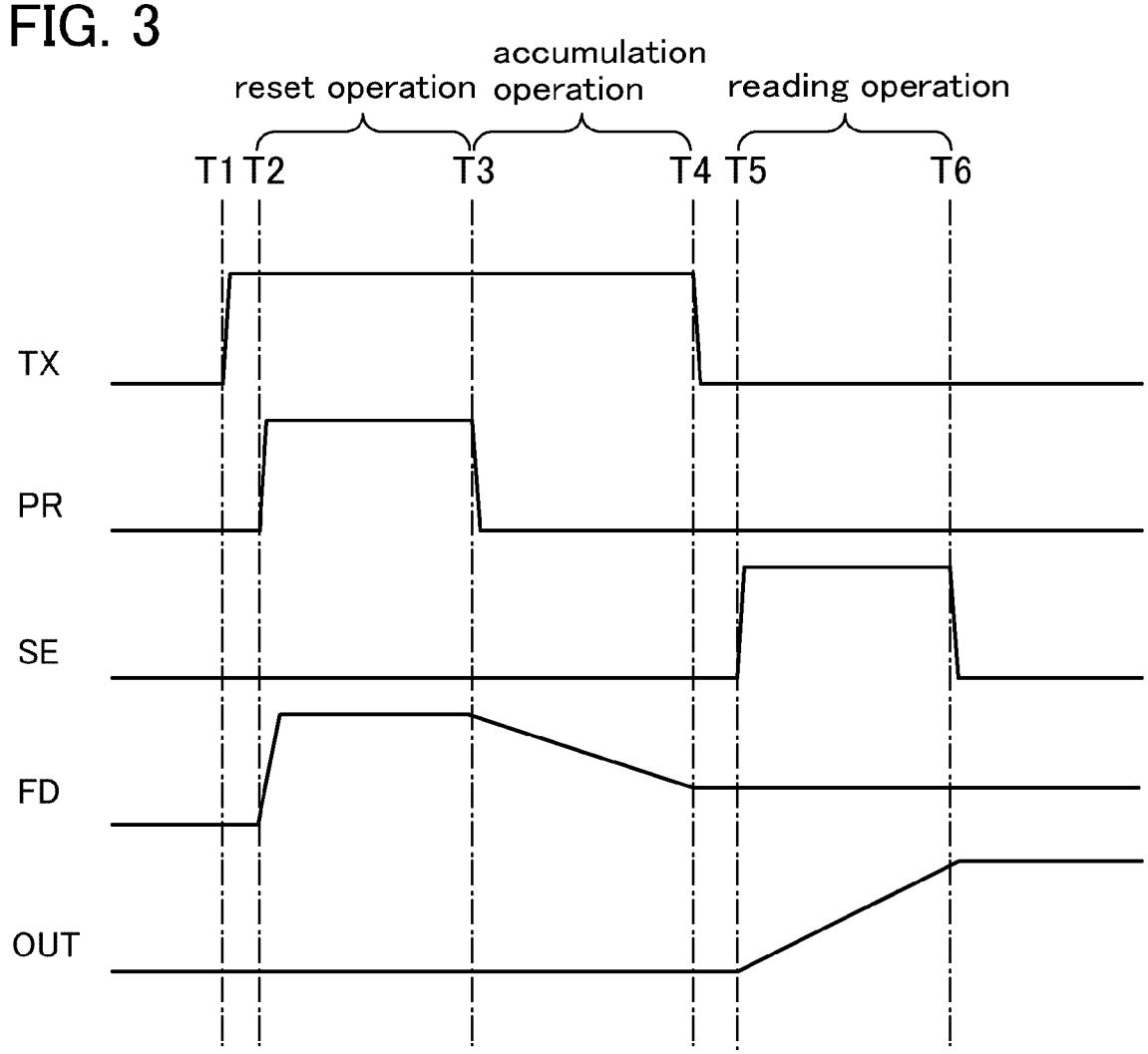
FIG. 3 is a timing chart for a photosensor.

First, the operation of each of the photosensors 101 will be described. FIG. 3 illustrates a timing chart of various potentials supplied to the photosensor 101 illustrated in FIGS. 2A and 2B, as an example.

Note that in the timing chart illustrated in FIG. 3, for easy understanding of operation of the photosensor 101, it is assumed that the wiring TX, the wiring SE, and the wiring PR are supplied with a high-level potential and a low-level potential. Specifically, it is assumed that the wiring TX is supplied with a high-level potential HTX and a low-level potential LTX; the wiring SE, a high-level potential HSE and a low-level potential LSE; and the wiring PR, a high-level potential HPR and a low-level potential LPR.

First, at a time T1, the potential of the wiring TX is changed from the potential LTX to the potential HTX. When the potential of the wiring TX is changed to the potential HTX, the transistor 104 is turned on. Note that at the time T1, the wiring SE is supplied with the potential LSE, and the wiring PR is supplied with the potential LPR.

Next, at a time T2, the potential of the wiring PR is changed from the potential LPR to the potential HPR. At the time T2, the potential of the wiring TX is kept at the potential HTX, and the potential of the wiring SE is kept at the potential LSE. Accordingly, the node FD is supplied with the potential HPR of the wiring PR; thus, the amount of charge held at the node FD is reset.

Then, at a time T3, the potential of the wiring PR is changed from the potential HPR to the potential LPR. Until shortly before the time T3, the potential of the node FD is kept at the potential HPR. Thus, when the potential of the wiring PR is changed to the potential LPR, a reverse bias voltage is applied to the photodiode 102. Then, when light enters the photodiode 102 in a state where a reverse bias voltage is applied to the photodiode 102, current flows from the cathode of the photodiode 102 toward the anode thereof. The value of the current varies according to the intensity of light. In other words, as the intensity of light entering the photodiode 102 increases, the value of the current increases and the amount of charge leaking out from the node FD also increases. Conversely, as the intensity of light entering the photodiode 102 decreases, the value of the current decreases and the amount of charge leaking out from the node also FD decreases. Thus, the higher the intensity of light becomes, the larger the amount of change in the potential of the node FD becomes; the lower the intensity of light becomes, the smaller the amount of change becomes.

Then, at a time T4, when the potential of the wiring TX is changed from the potential HTX to the potential LTX, the transistor 104 is turned off. Accordingly, the movement of charge from the node FD to the photodiode 102 is stopped and thus the potential of the node FD is determined.

Next, at a time T5, when the potential of the wiring SE is changed from the potential LSE to the potential HSE, the transistor 106 is turned on. Then, according to the potential of the node FD, charge is moved from the wiring VR to the wiring OUT.

Next, at a time T6, when the potential of the wiring SE is changed from the potential HSE to the potential LSE, the movement of charge from the wiring VR to the wiring OUT is stopped and the potential of the wiring OUT is determined. The potential of the wiring OUT corresponds to the potential of the output signal of the photosensor 101. In addition, the potential of the output signal contains data of a taken image of an object.

The above-described series of operations can be classified into a reset operation, an accumulation operation, and a reading operation. In other words, an operation from the time T2 to the time T3 corresponds to the reset operation; an operation from the time T3 to the time T4, the accumulation operation; and an operation from the time T5 to the time T6, the reading operation. By performing the reset operation, the accumulation operation, and the reading operation, image data can be obtained.

Furthermore, a period between the end of the accumulation operation and the start of the reading operation, i.e., a period from the time T4 to the time T5, corresponds to a charge holding period in which charge is held at the node FD. In one embodiment of the present invention, the pixel portion is operated by a global shutter method, and thus, the length of the charge holding period differs among rows of pixels. Reasons for this difference will be described below.

Figure 4:
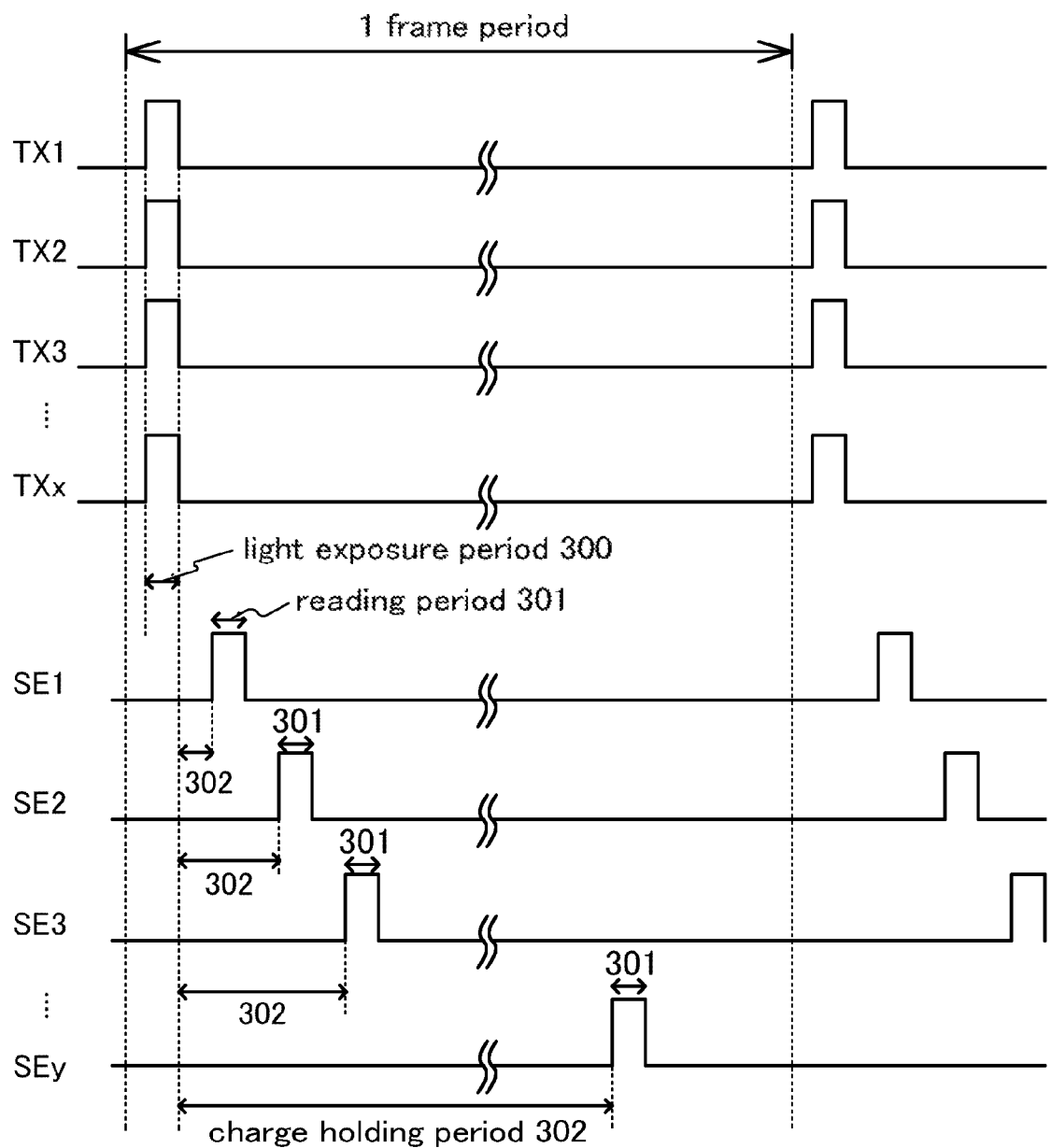
FIG. 4 is a timing chart for a wiring TX and a wiring SE.

First, an example of operation of a pixel portion by a global shutter method will be described. FIG. 4 illustrates a timing chart of potentials supplied to the wirings TX1 to TXx and the wirings SE1 to SEy in the pixel portion illustrated in FIG. 2B, as an example.

In the timing chart illustrated in FIG. 4, the reset operation and the accumulation operation from the time T2 to the time T4 are performed by all the photosensors 101 concurrently. Thus, the potentials of the wirings TX1 to TXx are changed from the potential LTX to the potential HTX simultaneously at the time T1 and changed from the potential HTX to the potential LTX simultaneously at the time T4. In FIG. 4, a period in which the reset operation and the accumulation operation are performed is referred to as a light exposure period 300.

In the timing chart illustrated in FIG. 4, the reading operation from the time T5 to the time T6 is sequentially performed on the photosensors 101 row by row. In other words, the timings of the time T5 and the time T6 differ among rows of the photosensors 101. Specifically, the potential of the wiring SE1 is changed from the potential LSE to the potential HSE and is then changed from the potential HSE to the potential LSE. After that, the potentials of the wirings SE2 to SEy are also sequentially changed in a similar manner. In FIG. 4, a period in which the reading operation is performed is referred to as a reading period 301.

As can be seen from FIG. 4, in the case of operating the pixel portion by a global shutter method, the reset operation and the accumulation operation are performed by all pixels simultaneously, and therefore, the light exposure period 300 ends in all pixels at substantially the same timing. On the other hand, the reading operation is performed on photosensors row by row, and therefore, the reading period 301 starts at different timings in different rows of photosensors. Accordingly, the length of a charge holding period 302 between the end of the light exposure period 300 and the start of the reading period 301 differs among rows of photosensors, and the charge holding period 302 of the photosensors in the last row is the longest.

When an image with a uniform grayscale level is taken, all photosensors ideally provide output signals having the same level of potential. However, in the case where the length of the charge holding period 302 differs among rows of photosensors, if charge accumulated at the node FD leaks out over time, the potential of an output signal of a photosensor differs among rows, and image data with different grayscale levels are obtained from different rows.

On the other hand, in one embodiment of the present invention, the transistor 104 with significantly small off-state current may be used as a switching element for holding charge accumulated in the photosensor 101, specifically, charge accumulated at the node FD. In that case, even when an image is taken by a global shutter method, it is possible to suppress variation in grayscale level of image data due to a difference in the length of the charge holding period, and it is possible to take a high-quality image.

Note that an image can be taken with a solid-state imaging device by utilizing external light and an image can also be taken by utilizing not external light but light from a backlight, like a contact area sensor, for example. In the case of using a backlight in one embodiment of the present invention, color image data may be obtained by FS operation of the backlight. By the FS operation, color image data can be obtained by additive color mixing using image data corresponding to a plurality of colors.

Figure 5:
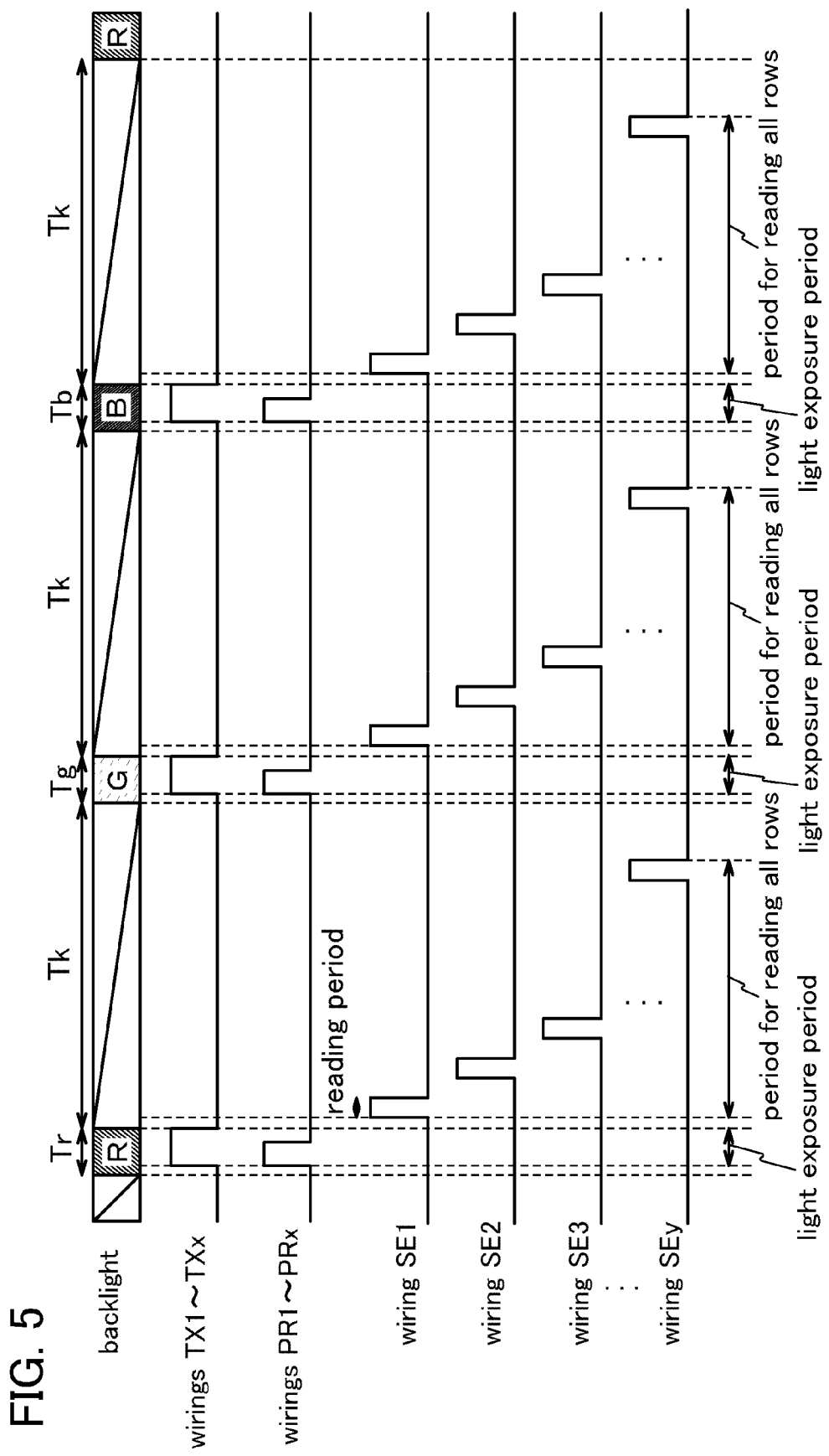
FIG. 5 is a diagram illustrating a lighting period and a non-lighting period of a light source and changes in potentials of a wiring TX, a wiring PR, and a wiring SE over time.

The operation of light sources and the operation of a pixel portion in the case of FS operation of a backlight in a solid-state imaging device will be described with reference to FIG. 5. FIG. 5 illustrates lighting periods and non-lighting periods of three light sources corresponding to red (R), green (G), and blue (B) and changes in potentials of the wirings TX, the wirings PR, and the wirings SE over time.

Note that FIG. 5 illustrates an example in which a backlight includes a light source which emits red (R) light, a light source which emits green (G) light, and a light source which emits blue (B) light; however, the kinds of light sources included in a backlight are not limited to this example. FIG. 5 illustrates the operation of a solid-state imaging device having the configuration in FIGS. 2A and 2B, as an example.

As illustrated in FIG. 5, in the case of FS operation of the backlight, the light sources of different colors are sequentially turned on. Specifically, in FIG. 5, a lighting period Tr in which the light source for red (R) is turned on, a non-lighting period Tk in which all the light sources are turned off, a lighting period Tg in which the light source for green (G) is turned on, a non-lighting period Tk in which all the light sources are turned off, and a lighting period Tb in which the light source for blue (B) is turned on are sequentially provided.

In the lighting period Tr, the reset operation and the accumulation operation corresponding to red (R) are performed by the photosensors of all the pixels simultaneously. In other words, a light exposure period in which the reset operation and the accumulation period are performed is provided in the lighting period Tr. In the light exposure period, signals which are input to the wirings Tx1 to TXx have pulses of potential, and periods in which the pulses appear coincide with each other. In addition, in the light exposure period, signals which are input to the wirings PR1 to PRx have pulses of potential, and periods in which the pulses appear coincide with each other.

In the non-lighting period Tk provided subsequent to the lighting period Tr, charge reading operation corresponding to red (R) is sequentially performed on the photosensors row by row. Thus, within a period for reading all rows, periods for reading the individual rows are sequentially provided. In addition, signals which are input to the wirings SE1 to SEy in the periods for reading the individual rows have pulses of potential. In other words, the pulses of the signals which are input to the wirings SE1 to SEy appear in such a manner that the pulses shift sequentially.

Similarly, in the lighting period Tg, the reset operation and the accumulation operation corresponding to green (G) are performed by the photosensors of all the pixels simultaneously. In other words, a light exposure period in which the reset operation and the accumulation period are performed is provided in the lighting period Tg. In addition, similarly, in the non-lighting period Tk provided subsequent to the lighting period Tg, charge reading operation corresponding to green (G) is sequentially performed on the photosensors row by row.

Similarly, in the lighting period Tb, the reset operation and the accumulation operation corresponding to blue (B) are performed by the photosensors of all the pixels simultaneously. In other words, a light exposure period in which the reset operation and the accumulation period are performed is provided in the lighting period Tb. In addition, similarly, in the non-lighting period Tk provided subsequent to the lighting period Tb, charge reading operation corresponding to blue (B) is sequentially performed on the photosensors row by row.

Through the above operations, image data corresponding to the colors can be obtained. Then, color image data can be obtained by combining the image data corresponding to the colors.

Note that another non-lighting period Tk may be added, and image data may be obtained in that non-lighting period. By subtracting image data obtained in the non-lighting period from the image data corresponding to the colors, high-contrast color image data with less influence of external light can be obtained.

Note that in the case of a solid-state imaging device, it is not necessarily needed to insert a non-lighting period between lighting periods, but by inserting a non-lighting period, it becomes possible to prevent leakage of charge in the charge holding period.

In the case of FS operation of the backlight, light sources of different colors need to be sequentially turned on one after another so as to emit light, unlike in the case of combining a light source of a single color with color filters. In addition, the frequency at which each light source is switched to another needs to be set higher than the frame frequency in the case of using a light source of a single color. For example, when the frame frequency in the case of using a light source of a single color is 60 Hz, the frequency at which each light source is switched to another in the case of performing FS operation using light sources corresponding to colors of red, green, and blue is approximately 180 Hz which is about three times as high as the frame frequency. Thus, a period when the light source of each color emits light is very short. On the other hand, in one embodiment of the present invention, an image is taken by a global shutter method; thus, charge reset operation and accumulation operation can be performed by all pixels simultaneously. Accordingly, it can take less time for all pixels to complete accumulation operation, as compared to the case of using a rolling shutter method. Therefore, even when a period when the light source of each color emits light is made short by employing FS operation, accumulation operation can be completed by all pixels within the above period.

In addition, the adoption of FS operation eliminates the need to provide a color filter in each pixel and can increase use efficiency of light from a backlight. Accordingly, power consumption of a solid-state imaging device can be reduced. With a single pixel, image data corresponding to different colors can be obtained, or grayscale levels corresponding to different colors can be displayed; thus, high-resolution image data can be obtained, or a high-definition image can be displayed.

Next, an example of a pixel in a semiconductor display device according to one embodiment of the present invention will be described. In a solid-state imaging device, a photosensor is provided in each pixel; in a semiconductor display device, a display element as well as a photosensor is provided in each pixel. In a semiconductor display device, the configuration illustrated in FIG. 1 or FIG. 2B can also be employed as a configuration of connections among photosensors. Furthermore, in a semiconductor display device, the configuration of the photosensor illustrated in FIG. 1 or FIG. 2A can also be employed.

Figure 6:
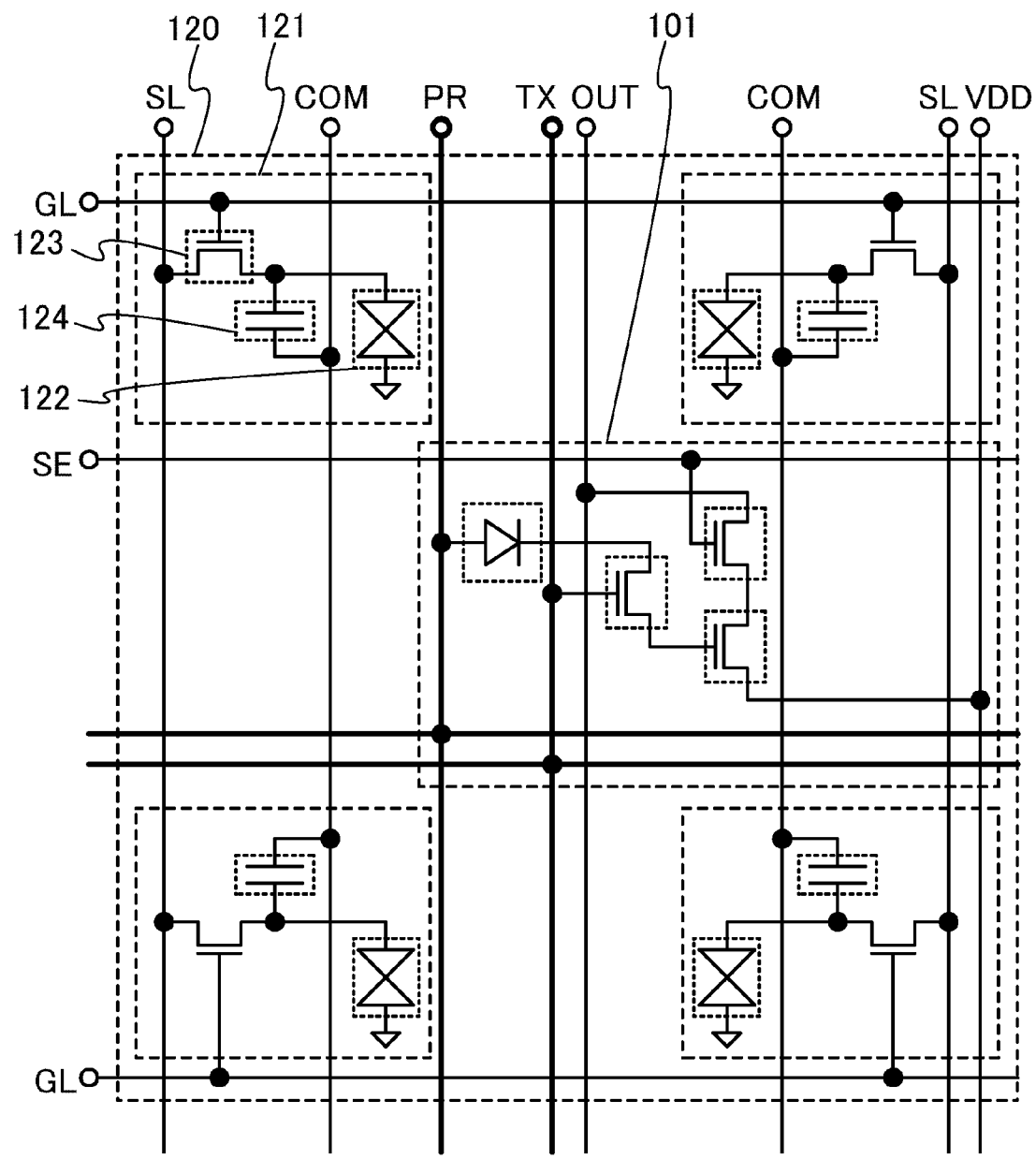
FIG. 6 is a circuit diagram illustrating a configuration of a pixel included in a semiconductor display device.

FIG. 6 is a circuit diagram illustrating an example of a configuration of a pixel included in a semiconductor display device. In FIG. 6, a pixel 120 includes four display elements 121 and one photosensor 101. Note that in a semiconductor display device according to one embodiment of the present invention, the number of display elements 121 and photosensors 101 included in each pixel is not limited to that in the configuration illustrated in FIG. 6.

In FIG. 6, the photosensor 101 having the configuration illustrated in FIG. 2A is used in the pixel 120.

The display element 121 includes a liquid crystal element 122 and a circuit element such as a transistor for controlling the operation of the liquid crystal element 122. Specifically, FIG. 6 illustrates an example in which the display element 121 includes the liquid crystal element 122, a transistor 123 functioning as a switching element, and a capacitor 124. The liquid crystal element 122 includes a pixel electrode, a counter electrode, and a liquid crystal to which a voltage is applied using the pixel electrode and the counter electrode.

Note that the display element 121 may further include another circuit element such as a transistor, a diode, a resistor, a capacitor, or an inductor as needed.

A gate electrode of the transistor 123 is connected to a scan line GL. A first terminal of the transistor 123 is connected to a signal line SL, and a second terminal thereof is connected to the pixel electrode of the liquid crystal element 122. One of a pair of electrodes included in the capacitor 124 is connected to the pixel electrode of the liquid crystal element 122, and the other thereof is connected to a wiring COM which is supplied with a fixed potential.

Figure 7:
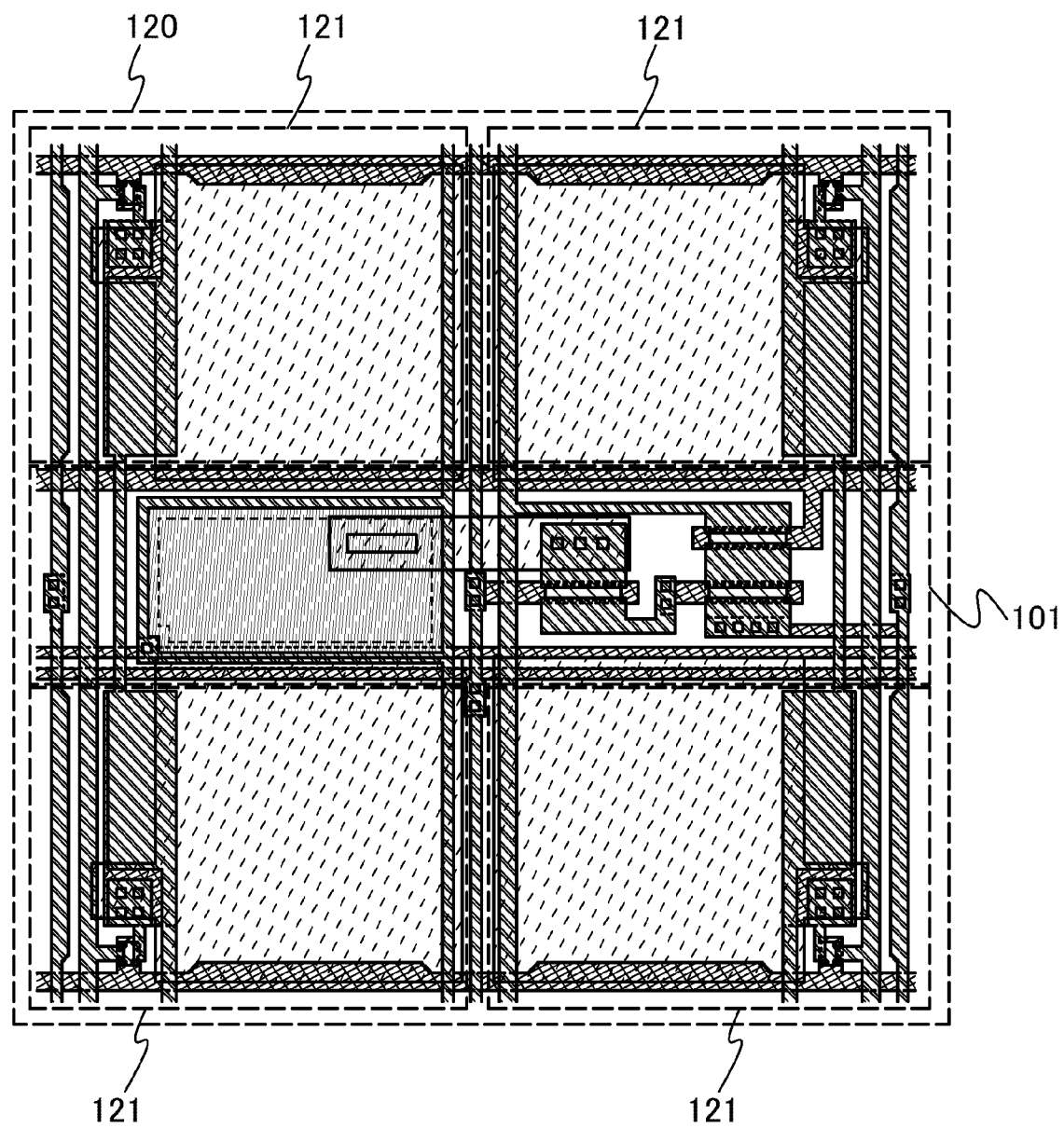
FIG. 7 is a diagram illustrating an example of a top view of a pixel.

Next, a layout of a pixel of a semiconductor display device according to one embodiment of the present invention will be described using the pixel illustrated in FIG. 6 as an example. FIG. 7 illustrates an example of a top view of the pixel 120 illustrated in FIG. 6. The pixel 120 illustrated in FIG. 7 includes one photosensor 101 and four display elements 121 as in FIG. 6.

Figure 8:
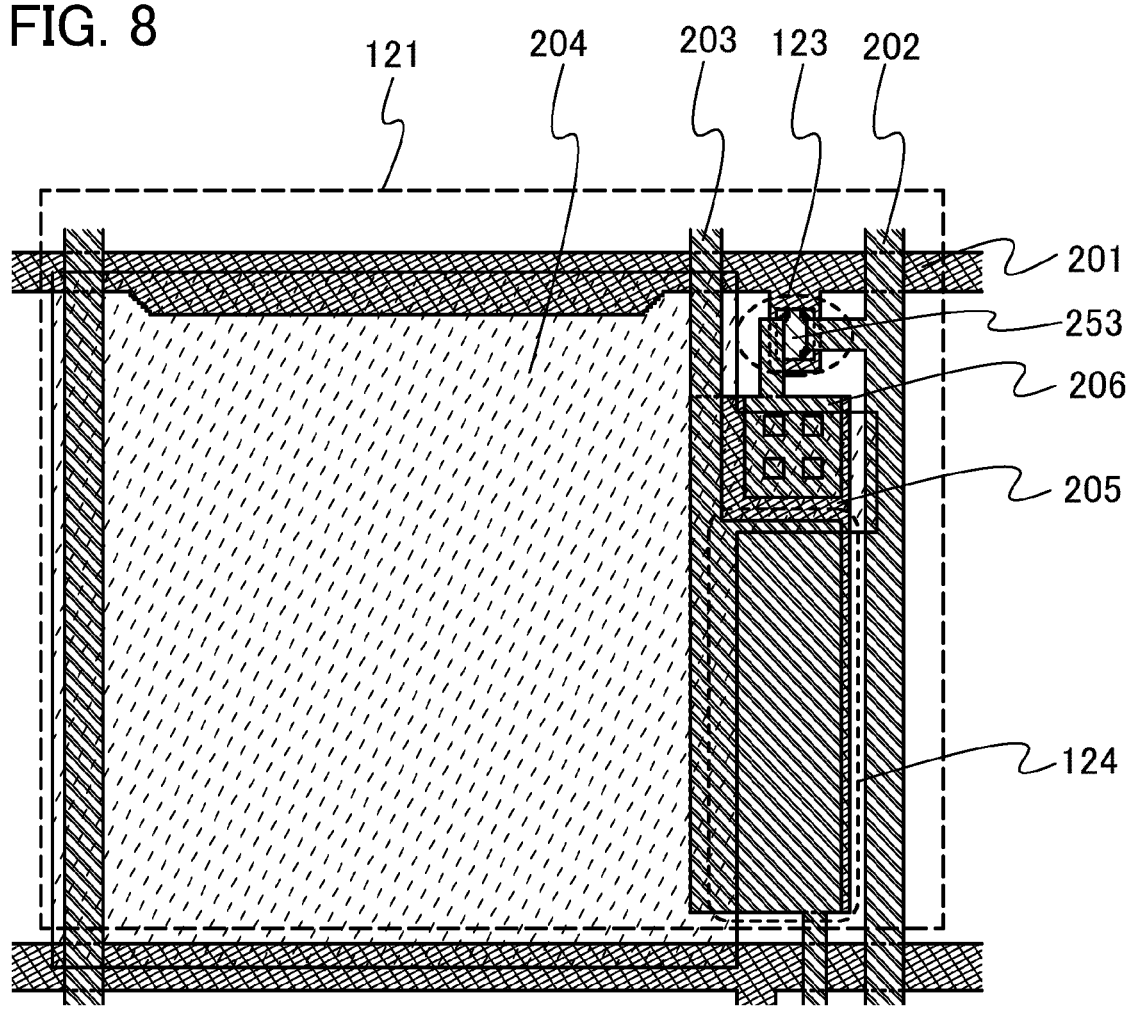
FIG. 8 is a top view of a display element.

FIG. 8 is an enlarged view of one of the display elements 121 illustrated in FIG. 7. The display element 121 includes a conductive film 201 functioning as the scan line GL, a conductive film 202 functioning as the signal line SL, and a conductive film 203 functioning as the wiring COM. The conductive film 201 also functions as the gate electrode of the transistor 123. The conductive film 202 also functions as the first terminal of the transistor 123. The display element 121 further includes a pixel electrode 204, a conductive film 205, and a conductive film 206. The conductive film 206 functions as the second terminal of the transistor 123. The conductive film 206 and the pixel electrode 204 are connected.

The conductive film 206 is connected to the conductive film 205, and a portion where the conductive film 203 functioning as the wiring COM and the conductive film 205 overlap each other with a gate insulating film interposed therebetween functions as the capacitor 124.

Note that various insulating films including the gate insulating film are not illustrated in FIG. 7 and FIG. 8 for clear illustration of the components such as the wirings, the transistors, and the capacitors.

The conductive film 201 and the conductive film 205 can be formed by processing one conductive film formed over an insulating surface into a desired shape. The gate insulating film is formed over the conductive film 201 and the conductive film 205. Furthermore, the conductive film 202, the conductive film 203, and the conductive film 206 can be formed by processing one conductive film formed over the gate insulating film into a desired shape.

Note that in the case where the transistor 123 is a bottom-gate transistor and an active layer 253 thereof includes an oxide semiconductor, it is preferable to employ a structure in which the active layer 253 is provided over the conductive film 201 functioning as the gate electrode, so as not to extend beyond the conductive film 201 as illustrated in FIG. 8. This configuration can prevent the oxide semiconductor in the active layer 253 from deteriorating due to light incident from the substrate side and can thus prevent deterioration of characteristics such as a shift of the threshold voltage of the transistor 123.

Figure 9A:
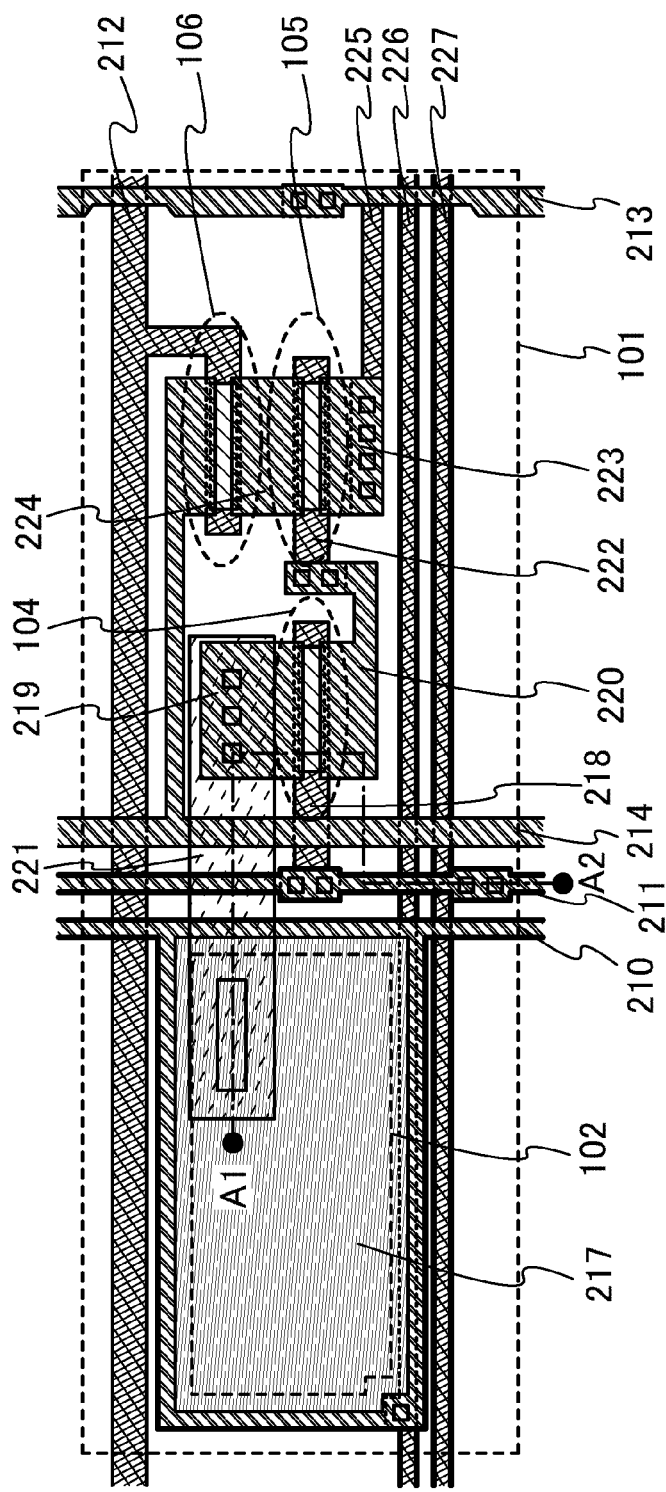
FIGS. 9A and 9B are a top view and a cross-sectional view of a photosensor.
Figure 9B:
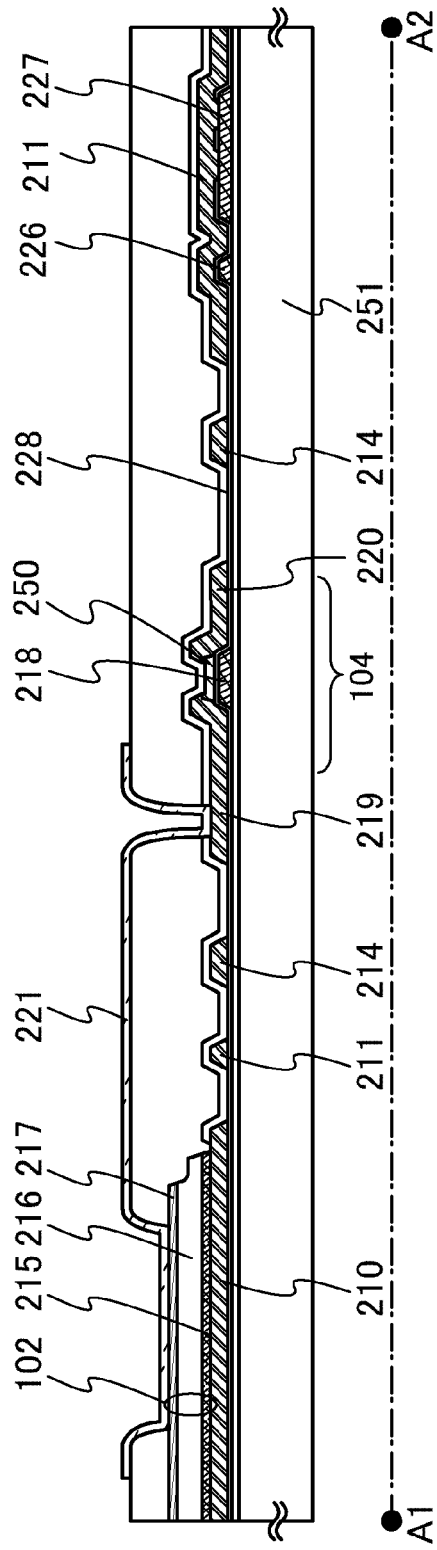

FIG. 9A is an enlarged view of one of the photosensors 101 illustrated in FIG. 7. FIG. 9B is a cross-sectional view taken along broken line A1-A2 of FIG. 9A.

The photosensor 101 includes a conductive film 210 functioning as the wiring PR, a conductive film 211 functioning as the wiring TX, a conductive film 212 functioning as the wiring SE, a conductive film 213 functioning as the wiring VR, and a conductive film 214 functioning as the wiring OUT.

The photodiode 102 included in the photosensor 101 includes a p-type semiconductor film 215, an i-type semiconductor film 216, and an n-type semiconductor film 217 which are sequentially stacked. The conductive film 210 is connected to the p-type semiconductor film 215 functioning as the anode of the photodiode 102.

A conductive film 218 included in the photosensor 101 functions as the gate electrode of the transistor 104 and is connected to the conductive film 211. A conductive film 219 included in the photosensor 101 functions as the first terminal of the transistor 104. A conductive film 220 included in the photosensor 101 functions as the second terminal of the transistor 104. A conductive film 221 included in the photosensor 101 is connected to the n-type semiconductor film 217 and the conductive film 219. A conductive film 222 included in the photosensor 101 functions as the gate electrode of the transistor 105 and is connected to the conductive film 220.

A conductive film 223 included in the photosensor 101 functions as the first terminal of the transistor 105. A conductive film 224 included in the photosensor 101 functions as the second terminal of the transistor 105 and the first terminal of the transistor 106. The conductive film 214 also functions as the second terminal of the transistor 106. The conductive film 212 also functions as the gate electrode of the transistor 106. The conductive film 225 included in the photosensor 101 is connected to the conductive film 223 and the conductive film 213.

A conductive film 226 included in the photosensor 101 is connected to the conductive film 210 functioning as the wiring PR. Although not illustrated in FIGS. 9A and 9B, a plurality of conductive films 210 functioning as the wirings PR is provided in the pixel portion. In one embodiment of the present invention, the conductive film 226 is connected to at least two of the plurality of conductive films 210.

A conductive film 227 included in the photosensor 101 is connected to the conductive film 211 functioning as the wiring TX. Although not illustrated in FIG. 9, a plurality of conductive films 211 functioning as the wirings TX is provided in the pixel portion. In one embodiment of the present invention, the conductive film 227 is connected to at least two of the plurality of conductive films 211.

The conductive film 212, the conductive film 218, the conductive film 222, the conductive film 225, the conductive film 226, and the conductive film 227 can be formed by processing one conductive film formed over an insulating surface into a desired shape. A gate insulating film 228 is formed over the conductive film 212, the conductive film 218, the conductive film 222, the conductive film 225, the conductive film 226, and the conductive film 227. The conductive film 210, the conductive film 211, the conductive film 213, the conductive film 214, the conductive film 219, the conductive film 220, the conductive film 223, and the conductive film 224 can be formed by processing one conductive film formed over the gate insulating film 228 into a desired shape.

Note that the conductive film 226 connecting the wirings PR to each other and the conductive films 210 functioning as the wirings PR are formed using different conductive films in this embodiment; however, one embodiment of the present invention is not limited to this structure. One conductive film may have both a function to connect the wirings PR to each other and a function as the wirings PR. In other words, in that case, the conductive film has a net-like shape in the pixel portion.

The conductive film 227 connecting the wirings TX to each other and the conductive films 211 functioning as the wirings TX are formed using different conductive films in this embodiment; however, one embodiment of the present invention is not limited to this structure. One conductive film may have both a function to connect the wirings TX to each other and a function as the wirings TX. In other words, in that case, the conductive film has a net-like shape in the pixel portion.

The above structure can suppress a potential decrease or a signal delay due to the resistance of the wirings PR and the wirings TX. As a result, it is possible to prevent a potential supplied to the anode of the photodiode 102 or a potential of a signal for controlling the switching of the transistor 104 for holding charge from varying within the pixel portion. Accordingly, it is possible to prevent a potential of a signal to be output from the photosensor 101 from varying, and it is possible to take a high-quality image.

Note that the cross-sectional view of the photosensor 101 in FIG. 9B illustrates a state after the process up to and including the step of forming the conductive film 221. In the semiconductor display device, the display element 121 as well as the photosensor 101 is provided in the pixel 120; thus, a liquid crystal element is practically formed after the conductive film 221 is formed.

Note that in the case where the transistor 104 is a bottom-gate transistor and an active layer 250 thereof includes an oxide semiconductor, it is preferable to employ a structure in which the active layer 250 is provided over the conductive film 218 functioning as the gate electrode, so as not to extend beyond the conductive film 218 as illustrated in FIGS. 9A and 9B. This configuration can prevent the oxide semiconductor in the active layer 250 from deteriorating due to light incident from the substrate 251 side and can thus prevent deterioration of characteristics such as a shift of the threshold voltage of the transistor 104. Note that by employing the above configuration for the transistor 105 and the transistor 106, a similar effect can be obtained.

Figure 16:
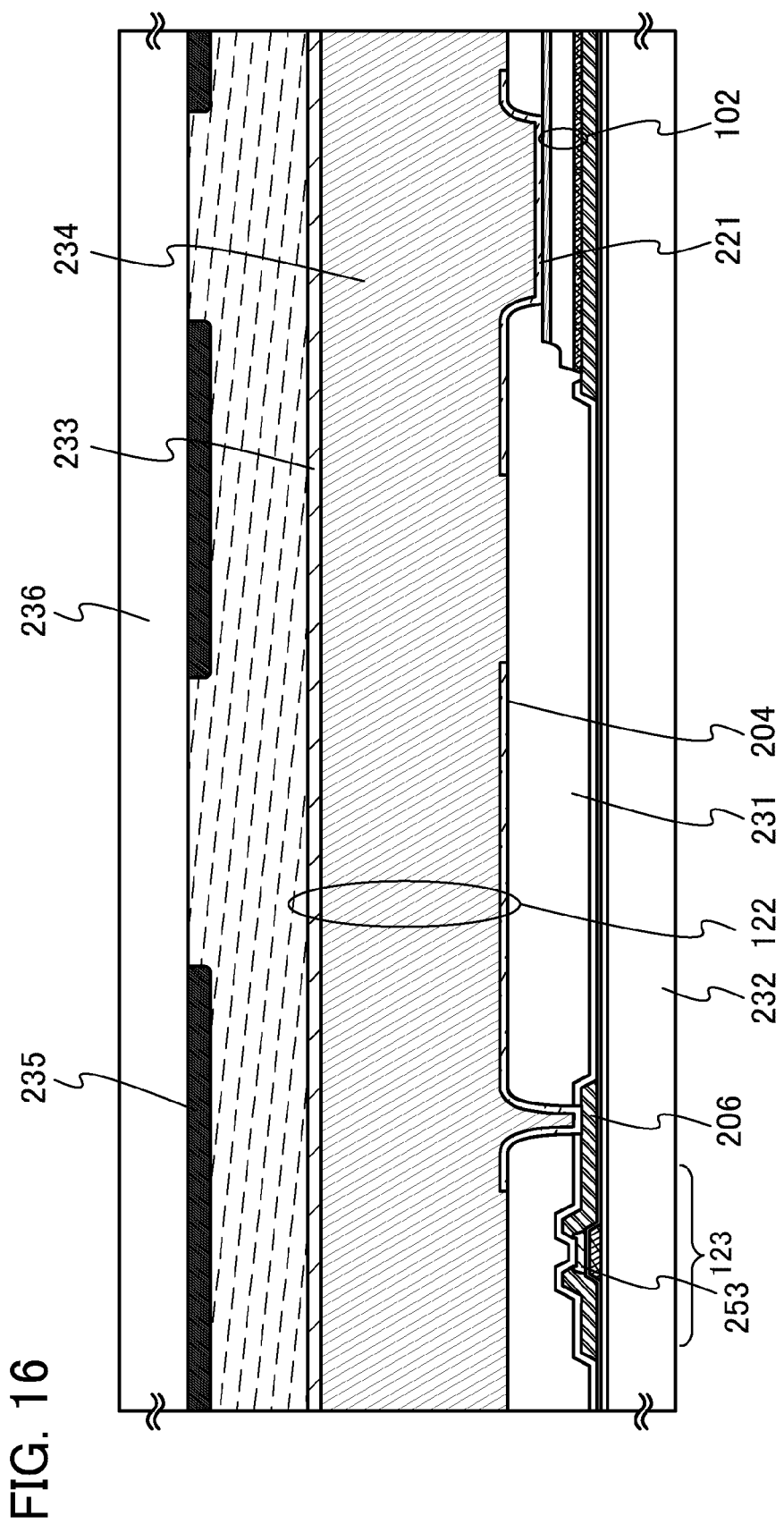
FIG. 16 is a cross-sectional view of a panel.

FIG. 16 is a cross-sectional view of a pixel, which illustrates the transistor 123 of the display element 121 and the photodiode 102 of the photosensor 101. The conductive film 206 functioning as the second terminal of the transistor 123 is connected to the pixel electrode 204. The conductive film 221 connected to the photodiode 102 and the pixel electrode 204 can be formed by processing one conductive film formed over an insulating film 231 covering the transistor 123 and the photodiode 102 into a desired shape.

A substrate 236 is disposed so as to face a substrate 232 provided with the pixel electrode 204. The substrate 236 is provided with a counter electrode 233, and a liquid crystal layer 234 including a liquid crystal is provided between the pixel electrode 204 and the counter electrode 233. The liquid crystal element 122 is formed in a portion where the pixel electrode 204, the counter electrode 233, and the liquid crystal layer 234 overlap each other.

Note that an alignment film may be provided as appropriate between the pixel electrode 204 and the liquid crystal layer 234 or between the counter electrode 233 and the liquid crystal layer 234. The alignment film can be formed using an organic resin such as polyimide or polyvinyl alcohol. Alignment treatment such as rubbing is performed on its surface in order to align liquid crystal molecules in a certain direction. Rubbing can be performed by rotating a roller wrapped with cloth of nylon or the like so as to be in contact with the alignment film so that the surface of the alignment film is rubbed in a certain direction. Note that it is also possible to form the alignment film having alignment characteristics by using an inorganic material such as silicon oxide by an evaporation method, without performing alignment treatment.

Injection of a liquid crystal to form the liquid crystal layer 234 may be performed by a dispenser method (dripping method) or a dipping method (pumping method).

Note that the substrate 236 is provided with a blocking film 235 capable of blocking light, in order to prevent a disclination due to disordered orientation of the liquid crystal between pixels, or in order to prevent dispersed light from entering a plurality of adjacent pixels at the same time. An organic resin containing black pigment such as carbon black or low-valent titanium oxide having an oxidation number smaller than that of titanium dioxide can be used for the blocking film 235. Alternatively, a film of chromium can be used for the blocking film.

In the case where the active layer 253 includes an oxide semiconductor, when the blocking film 235 is provided so as to overlap with the active layer 253 of the transistor 123, it is possible to prevent the oxide semiconductor in the active layer 253 from deteriorating due to light incident from the substrate 236 side, and thus, it is possible to prevent deterioration of characteristics such as a shift of the threshold voltage of the transistor 123.

The pixel electrode 204 and the counter electrode 233 can be formed using a light-transmitting conductive material such as indium tin oxide including silicon oxide (ITSO), indium tin oxide (ITO), zinc oxide (ZnO), indium zinc oxide (IZO), or gallium-doped zinc oxide (GZO), for example.

A known liquid crystal in a twisted nematic (TN) mode, a vertical alignment (VA) mode, an optically compensated birefringence (OCB) mode, an in-plane switching (IPS) mode, a multi-domain vertical alignment (MVA) mode, or the like can be used for the liquid crystal layer 234.

Alternatively, a liquid crystal exhibiting a blue phase for which an alignment film is unnecessary may be used for the liquid crystal layer 234. A blue phase is one of liquid crystal phases, which is generated just before a cholesteric phase changes into an isotropic phase when the temperature of cholesteric liquid crystal is increased. Since the blue phase is only generated within a narrow range of temperature, a chiral agent or an ultraviolet curable resin is added so that the temperature range is improved. The liquid crystal composition which includes a liquid crystal exhibiting a blue phase and a chiral agent is preferable because it has a small response time of 1 msec or less, has optical isotropy, which makes the alignment process unneeded, and has a small viewing angle dependence.

Note that although the liquid crystal element in which the liquid crystal layer 234 is sandwiched between the pixel electrode 204 and the counter electrode 233 is illustrated in FIG. 16 as an example, the semiconductor display device according to one embodiment of the present invention is not limited to having this structure. A pair of electrodes may be formed over one substrate as in an IPS liquid crystal element or a liquid crystal element using a blue phase.

Figure 20:
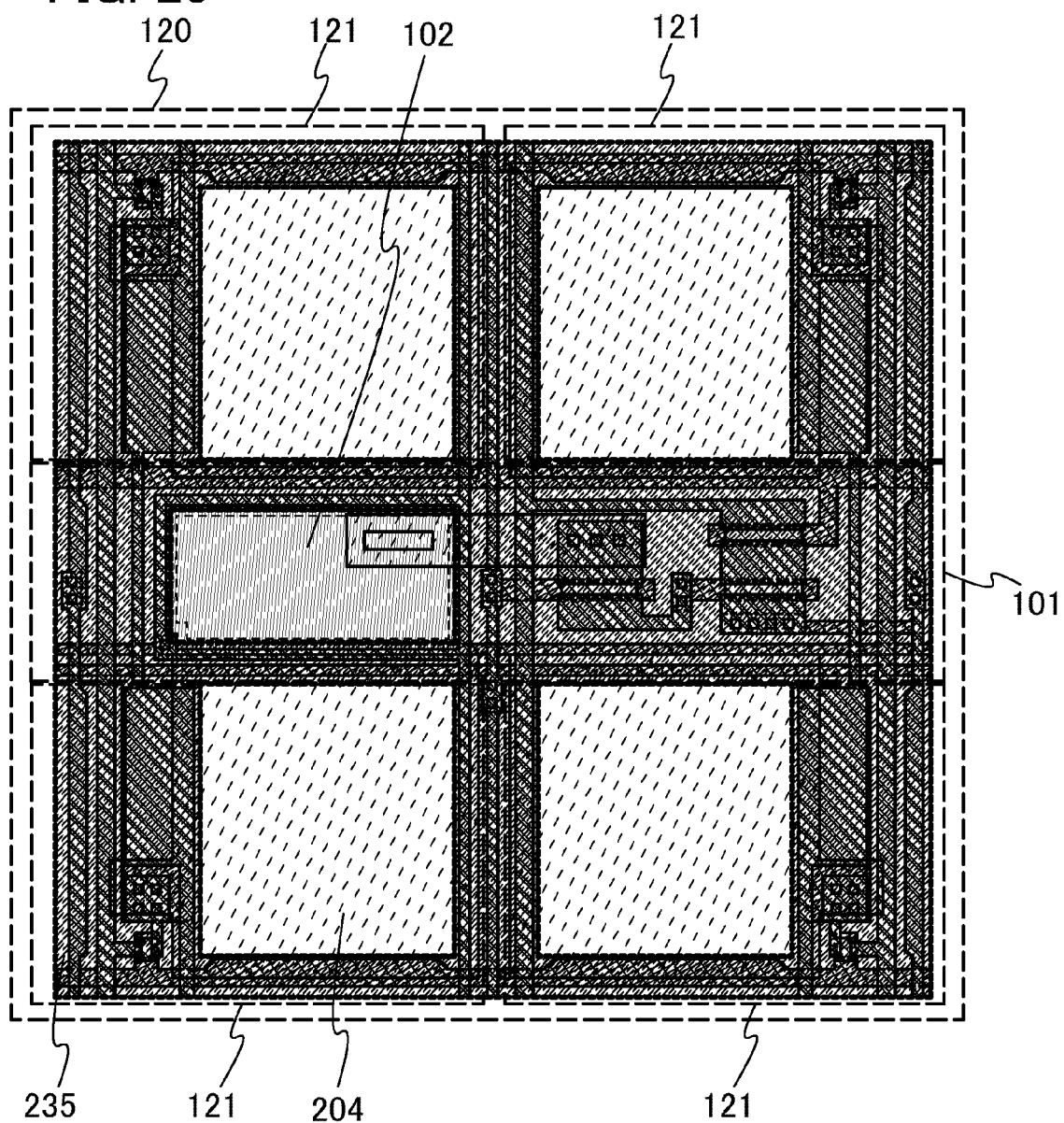
FIG. 20 is a diagram illustrating an example of a top view of a pixel.

Note that the blocking film 235 is preferably provided for not only the display element 121 but also the photosensor 101. FIG. 20 illustrates a state where the blocking film 235 overlaps with the pixel 120 illustrated in FIG. 7. In FIG. 20, the blocking film 235 has openings in a region overlapping with the pixel electrode 204 of the display element 121 and in a region overlapping with the photodiode 102 of the photosensor 101. Thus, even when the active layers of the transistors included in the display element 121 and the photosensor 101 include an oxide semiconductor, the blocking film 235 shields the active layers from light; accordingly, it is possible to prevent photodegradation of the oxide semiconductor, and it is possible to prevent deterioration of characteristics such as a shift of the threshold voltage of the transistors.

Note that in the case of forming a driving circuit on a panel, by disposing a gate electrode or a blocking film so as to shield a transistor included in the driver circuit from light, it is possible to prevent deterioration of characteristics such as a shift of the threshold voltage of the transistor.

Note that a solid-state imaging device or a semiconductor display device according to one embodiment of the present invention includes in its scope a panel where a pixel portion is formed between a pair of substrates, and a module in which an IC including a driver circuit, a controller, a CPU, a memory, or the like and a backlight are mounted on the panel. A driver circuit may be formed on the panel.

Next, the operation of light sources and the operation of a pixel portion in the case of FS operation of a semiconductor display device will be described with reference to FIG. 10. FIG. 10 illustrates lighting periods and non-lighting periods of three light sources corresponding to red (R), green (G), and blue (B) and changes in potentials of the wirings TX, the wirings PR, and the wirings SE over time.

Note that FIG. 10 illustrates an example in which a backlight includes a light source which emits red (R) light, a light source which emits green (G) light, and a light source which emits blue (B) light; however, the kinds of light sources included in a backlight are not limited to this example. FIG. 10 illustrates operation assuming that a pixel portion includes a plurality of pixels illustrated in FIG. 6 and the pixel portion is provided with wirings TX1 to TXx, wirings PR1 to PRx, and wirings SE1 to SEy.

As illustrated in FIG. 10, in the case of FS operation of the backlight, the light sources of different colors are sequentially turned on. Specifically, in FIG. 10, a lighting period Tr in which the light source for red (R) is turned on, a non-lighting period Tk in which all the light sources are turned off, a lighting period Tg in which the light source for green (G) is turned on, a non-lighting period Tk in which all the light sources are turned off, a lighting period Tb in which the light source for blue (B) is turned on, and a non-lighting period Tk in which all the light sources are turned off are sequentially provided in one frame period.

First, in the lighting period Tr in a first frame period, the reset operation and the accumulation operation corresponding to red (R) are performed by the photosensors of all the pixels simultaneously, in a manner similar to the solid-state imaging device. In other words, a light exposure period in which the reset operation and the accumulation period are performed is provided in the lighting period Tr. In the light exposure period, signals which are input to the wirings Tx1 to TXx have pulses of potential, and periods in which the pulses appear coincide with each other. In addition, in the light exposure period, signals which are input to the wirings PR1 to PRx have pulses of potential, and periods in which the pulses appear coincide with each other.

In a period between the end of the lighting period Tr and the start of the lighting period Tg in a second frame period, charge reading operation corresponding to red (R) is sequentially performed on the photosensors row by row. Thus, within a period for reading all rows, periods for reading the individual rows are sequentially provided. In addition, signals which are input to the wirings SE1 to SEy in the periods for reading the individual rows have pulses of potential. In other words, the pulses of the signals which are input to the wirings SE1 to SEy appear in such a manner that the pulses shift sequentially.

Similarly, in the lighting period Tg in the second frame period, the reset operation and the accumulation operation corresponding to green (G) are performed by the photosensors of all the pixels simultaneously. In other words, a light exposure period in which the reset operation and the accumulation period are performed is provided in the lighting period Tg. Then, similarly, in a period between the end of the lighting period Tg and the start of the lighting period Tb in a third frame period, charge reading operation corresponding to green (G) is sequentially performed on the photosensors row by row.

Similarly, in the lighting period Tb in the third frame period, the reset operation and the accumulation operation corresponding to blue (B) are performed by the photosensors of all the pixels simultaneously. In other words, a light exposure period in which the reset operation and the accumulation period are performed is provided in the lighting period Tb. Then, similarly, in a period between the end of the lighting period Tb and the start of the lighting period Tr in a fifth frame period, charge reading operation corresponding to blue (B) is sequentially performed on the photosensors row by row.

Through the above operations, image data corresponding to the colors can be obtained. Then, color image data can be obtained by combining the image data corresponding to the colors.

Note that another non-lighting period Tk may be added, and image data may be obtained in that non-lighting period. By subtracting image data obtained in the non-lighting period from the image data corresponding to the colors, high-contrast color image data with less influence of external light can be obtained.

In the case of FS operation of the backlight, light sources of different colors need to be sequentially turned on one after another so as to emit light, unlike in the case of combining a light source of a single color with color filters. In addition, the frequency at which each light source is switched to another needs to be set higher than the frame frequency in the case of using a light source of a single color. For example, when the frame frequency in the case of using a light source of a single color is 60 Hz, the frequency at which each light source is switched to another in the case of performing FS operation using light sources corresponding to colors of red, green, and blue is approximately 180 Hz which is about three times as high as the frame frequency. Thus, a period when the light source of each color emits light is very short. On the other hand, in one embodiment of the present invention, an image is taken by a global shutter method; thus, charge reset operation and accumulation operation can be performed by all pixels simultaneously. Accordingly, it can take less time for all pixels to complete accumulation operation, as compared to the case of using a rolling shutter method. Therefore, even when a period when the light source of each color emits light is made short by employing FS operation, accumulation operation can be completed by all pixels within the above period.

In addition, the adoption of FS operation eliminates the need to provide a color filter in each pixel and can increase use efficiency of light from a backlight. Accordingly, power consumption of the semiconductor display device can be reduced. With a single pixel, image data corresponding to different colors can be obtained, or grayscale levels corresponding to different colors can be displayed; thus, high-resolution image data can be obtained, or a high-definition image can be displayed.

Note that the above operation in the periods mentioned above is the operation of the semiconductor display device at the time of taking an image. In the case where the semiconductor display device displays an image, image signals corresponding to the colors are written to the display element 121 in the corresponding non-lighting periods Tk. Then, in the lighting periods, the display element 121 is made to display grayscale levels corresponding to the colors according to the image signals. Thus, a color image can be displayed.

Note that the response time of a liquid crystal from application of voltage to saturation of the change in transmittance is generally about ten milliseconds. Thus, since the proportion of the response time of a liquid crystal to the lighting period is high, a change in the transmittance of a liquid crystal element tends to be recognized as a blur of a moving image. However, by providing a period in which there is a significant change in transmittance of a liquid crystal and a non-lighting period Tk in parallel, and by providing a period in which the change in transmittance of the liquid crystal is saturated and each lighting period in parallel as described above, the change in transmittance can be prevented from being recognized and a high-quality image can be displayed.

(Embodiment 2)

In this embodiment, a configuration of the photosensor 101 which is different from that in FIG. 2A will be described.

Figure 11:
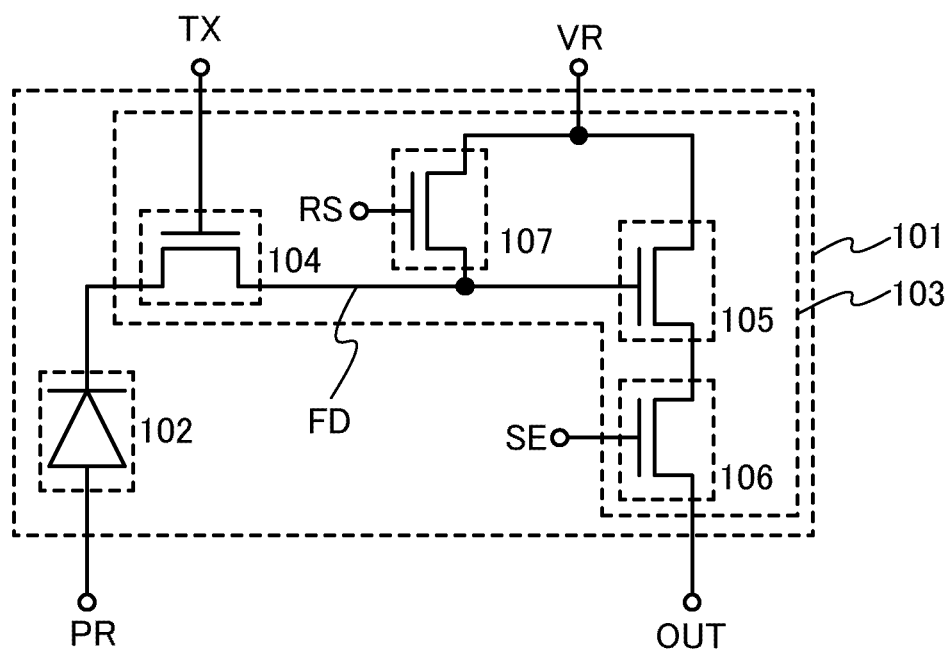
FIG. 11 is a circuit diagram of a photosensor.

FIG. 11 is a circuit diagram of an example of the photosensor 101. In the photosensor 101 illustrated in FIG. 11, the amplifier circuit 103 includes a transistor 104, a transistor 105, a transistor 106, and a transistor 107. The transistor 104 controls the supply of current generated in the photodiode 102 to the amplifier circuit 103. In the transistor 105, the current value or resistance value between a first terminal and a second terminal thereof is determined by a potential supplied to the second terminal of the transistor 104. The transistor 106 functions as a switching element for supplying a potential of an output signal determined by the current value or resistance value, to the wiring OUT. The transistor 107 functions to reset the amount of charge accumulated in the amplifier circuit 103.

Specifically, in FIG. 11, a first terminal of the transistor 104 is connected to the cathode of the photodiode 102, and a second terminal of the transistor 104 is connected to a gate electrode of the transistor 105 and a first terminal of the transistor 107. The first terminal of the transistor 105 and a second terminal of the transistor 107 are connected to a wiring VR which is supplied with a high-level power supply potential VDD. A gate electrode of the transistor 107 is connected to a wiring RS, and the wiring RS is supplied with a potential of a signal for controlling the switching of the transistor 107. The second terminal of the transistor 105 is connected to a first terminal of the transistor 106. A second terminal of the transistor 106 is connected to the wiring OUT. A gate electrode of the transistor 106 is connected to a wiring SE, and the wiring SE is supplied with a potential of a signal for controlling the switching of the transistor 106.

In FIG. 11, a node where the second terminal of the transistor 104, the first terminal of the transistor 107, and the gate electrode of the transistor 105 are connected to each other is denoted by a node FD. The potential of the output signal is determined by the amount of charge accumulated at the node FD. In order to hold charge at the node FD more reliably, a capacitor may be connected to the node FD.

Figure 12:
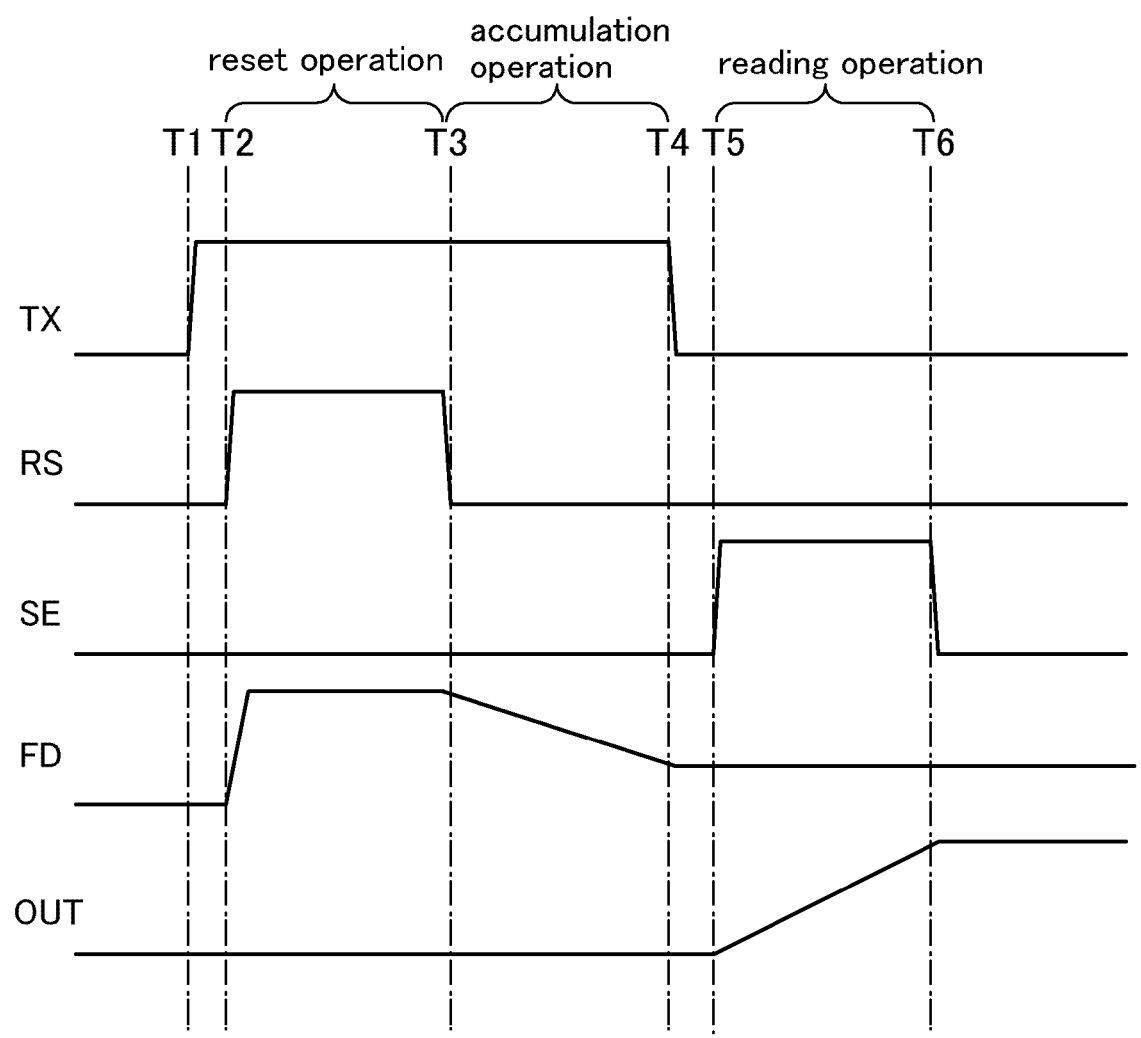
FIG. 12 is a timing chart for a photosensor.

Next, an example of operation of the photosensor 101 illustrated in FIG. 11 will be described. FIG. 12 illustrates a timing chart of various potentials applied to the photosensor 101 illustrated in FIG. 11, as an example.

Note that in the timing chart illustrated in FIG. 12, for easy understanding of operation of the photosensor 101, it is assumed that the wiring TX, the wiring SE, and the wiring RS are supplied with a high-level potential and a low-level potential. Specifically, it is assumed that the wiring TX is supplied with a high-level potential HTX and a low-level potential LTX; the wiring SE, a high-level potential HSE and a low-level potential LSE; and the wiring RS, a high-level potential HRS and a low-level potential LRS. The wiring PR is supplied with a low-level power supply potential VSS.

First, at a time T1, the potential of the wiring TX is changed from the potential LTX to the potential HTX. When the potential of the wiring TX is changed to the potential HTX, the transistor 104 is turned on. Note that at the time T1, the wiring SE is supplied with the potential LSE, and the wiring RS is supplied with the potential LRS.

Next, at a time T2, the potential of the wiring RS is changed from the potential LRS to the potential HRS. When the potential of the wiring RS is changed to the potential HRS, the transistor 107 is turned on. At the time T2, the potential of the wiring TX is kept at the potential HTX, and the potential of the wiring SE is kept at the potential LSE. Accordingly, the node FD is supplied with the power supply potential VDD; thus, the amount of charge held at the node FD is reset. A reverse bias voltage is applied to the photodiode 102.

Then, at a time T3, the potential of the wiring RS is changed from the potential HRS to the potential LRS. Until shortly before the time T3, the potential of the node FD is kept at the power supply potential VDD. Thus, even after the potential of the wiring RS is changed to the potential LRS, a reverse bias voltage continues to be applied to the photodiode 102. Then, when light enters the photodiode 102 in that state, current flows from the cathode of the photodiode 102 toward the anode thereof. The value of the current varies according to the intensity of light. In other words, as the intensity of light entering the photodiode 102 increases, the value of the current increases and the amount of charge leaking out from the node FD also increases. Conversely, as the intensity of light entering the photodiode 102 decreases, the value of the current decreases and the amount of charge leaking out from the node FD also decreases. Thus, the higher the intensity of light becomes, the larger the amount of change in the potential of the node FD becomes; the lower the intensity of light becomes, the smaller the amount of change becomes.

Then, at a time T4, when the potential of the wiring TX is changed from the potential HTX to the potential LTX, the transistor 104 is turned off. Accordingly, the movement of charge from the node FD to the photodiode 102 is stopped and thus the potential of the node FD is determined.

Next, at a time T5, when the potential of the wiring SE is changed from the potential LSE to the potential HSE, the transistor 106 is turned on. Then, according to the potential of the node FD, charge is moved from the wiring VR to the wiring OUT.

Next, at a time T6, when the potential of the wiring SE is changed from the potential HSE to the potential LSE, the movement of charge from the wiring VR to the wiring OUT is stopped and the potential of the wiring OUT is determined. The potential of the wiring OUT corresponds to the potential of the output signal of the photosensor 101. In addition, the potential of the output signal contains data of a taken image of an object.

The above-described series of operations can be classified into a reset operation, an accumulation operation, and a reading operation. In other words, an operation from the time T1 to the time T3 corresponds to the reset operation; an operation from the time T3 to the time T4, the accumulation operation; and an operation from the time T5 to the time T6, the reading operation. By performing the reset operation, the accumulation operation, and the reading operation, image data can be obtained.

Next, a configuration of the photosensor 101 which is different from that in FIG. 2A or FIG. 11 will be described.

Figure 13:
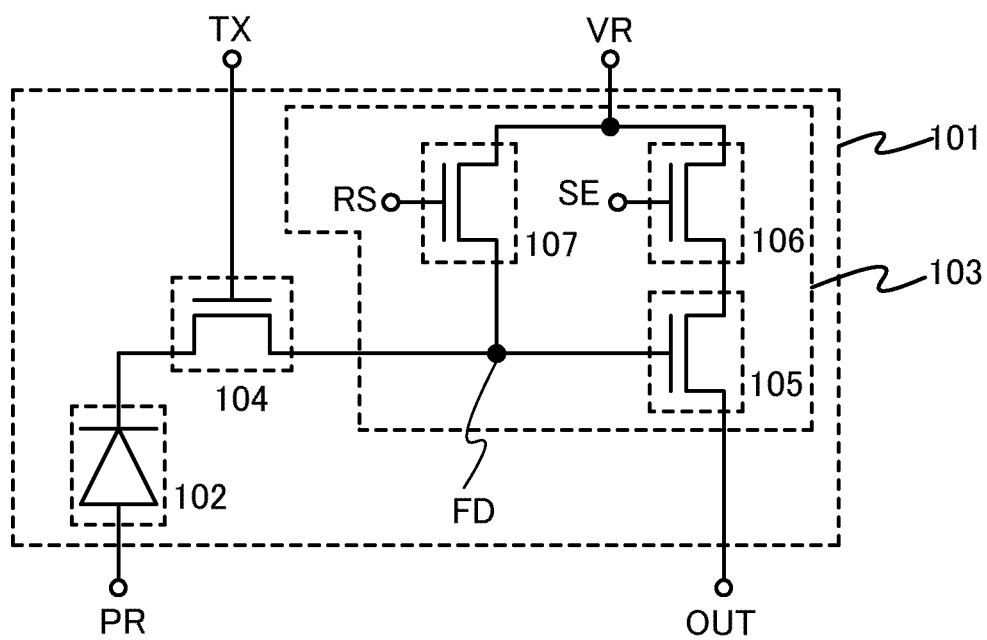
FIG. 13 is a circuit diagram of a photosensor.

FIG. 13 is a circuit diagram of an example of the photosensor 101. In the photosensor 101 illustrated in FIG. 13, the amplifier circuit 103 includes a transistor 104, a transistor 105, a transistor 106, and a transistor 107. The transistor 104 controls the supply of current generated in the photodiode 102 to the amplifier circuit 103. In the transistor 105, the current value or resistance value between a first terminal and a second terminal thereof is determined by a potential supplied to the second terminal of the transistor 104. The transistor 106 functions as a switching element for supplying a potential of an output signal determined by the current value or resistance value, to the wiring OUT. The transistor 107 functions to reset the amount of charge accumulated in the amplifier circuit 103.

Specifically, in FIG. 13, a first terminal of the transistor 104 is connected to the cathode of the photodiode 102, and a second terminal of the transistor 104 is connected to a gate electrode of the transistor 105 and a first terminal of the transistor 107. The first terminal of the transistor 105 is connected to a second terminal of the transistor 106, and the second terminal of the transistor 105 is connected to the wiring OUT. A first terminal of the transistor 106 and a second terminal of the transistor 107 are connected to a wiring VR which is supplied with a high-level power supply potential VDD. A gate electrode of the transistor 107 is connected to a wiring RS, and the wiring RS is supplied with a potential of a signal for controlling the switching of the transistor 107. A gate electrode of the transistor 106 is connected to a wiring SE, and the wiring SE is supplied with a potential of a signal for controlling the switching of the transistor 106.

In FIG. 13, a node at which the second terminal of the transistor 104, the first terminal of the transistor 107, and the gate electrode of the transistor 105 are connected to each other is denoted by a node FD. The potential of the output signal is determined by the amount of charge accumulated at the node FD. In order to hold charge at the node FD more reliably, a capacitor may be connected to the node FD.

For operation of the photosensor 101 illustrated in FIG. 13, the timing chart illustrated in FIG. 12 can be referred to.

A feature of the photosensor illustrated in FIG. 11 or FIG. 13 is that a channel formation region of the transistor 104 includes a semiconductor whose band gap is wider than that of silicon and whose intrinsic carrier density is lower than that of silicon. When a semiconductor material having the above-described characteristics is included in a channel formation region, the transistor 104 can have extremely small off-state current and high withstand voltage. Further, when the transistor 104 having the above-described structure is used as a switching element, leakage of charge accumulated in the amplifier circuit 103 can be prevented.

In FIG. 11 or FIG. 13, an oxide semiconductor film may be used for active layers of the transistor 104, the transistor 105, the transistor 106, and the transistor 107 included in the amplifier circuit 103. Alternatively, a semiconductor other than an oxide semiconductor, such as amorphous silicon, microcrystalline silicon, polycrystalline silicon, single crystal silicon, amorphous germanium, microcrystalline germanium, polycrystalline germanium, or single crystal germanium may be used for active layers of the transistor 104, the transistor 105, the transistor 106, and the transistor 107. With the use of an oxide semiconductor film for active layers of all transistors in the photosensor 101, a manufacturing process can be simplified. With the use of a semiconductor material capable of providing higher mobility than an oxide semiconductor, such as polycrystalline or single crystal silicon, for active layers of the transistor 105, the transistor 106, and the transistor 107, image data can be read from the photosensor 101 at high speed.

This embodiment can be implemented in combination with the above-described embodiment.

(Embodiment 3)

In this embodiment, a method for manufacturing a solid-state imaging device or a semiconductor display device according to one embodiment of the present invention, which has a transistor including silicon and a transistor including an oxide semiconductor, will be described.

Note that in one embodiment of the present invention, an oxide semiconductor may be used for a transistor included in an amplifier circuit, or a general semiconductor such as germanium, silicon, silicon germanium, or single crystal silicon carbide may be used. For example, the transistor including silicon can be formed using a single crystal semiconductor substrate such as a silicon wafer or the like, a silicon thin film which is formed by an SOI method, a silicon thin film which is formed by a vapor deposition method, or the like.

Figure 14A:
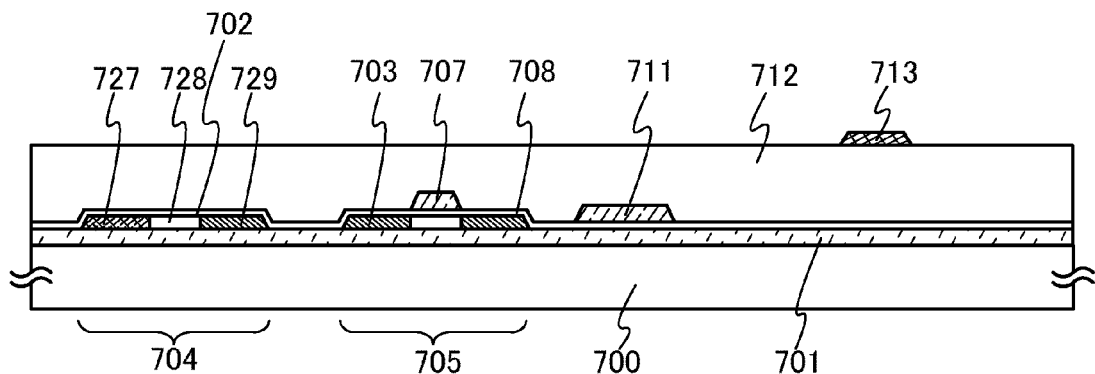
FIGS. 14A to 14C are cross-sectional views illustrating a method for manufacturing a transistor including silicon and a transistor including an oxide semiconductor.

First, as illustrated in FIG. 14A, a photodiode 704 and an n-channel transistor 705 are formed over an insulating surface of a substrate 700 by a known CMOS fabricating method. In this embodiment, the case where the photodiode 704 and the n-channel transistor 705 are formed with a single crystal semiconductor film which is separated from a single crystal semiconductor substrate is given as an example.

A specific example of a method for manufacturing the single crystal semiconductor film will be briefly described. First, an ion beam including ions which are accelerated by an electric field is delivered to the single crystal semiconductor substrate and an embrittled layer which is weakened by local disorder of the crystal structure is formed in a region at a certain depth from the surface of the semiconductor substrate. The depth at which the embrittled layer is formed can be adjusted by the acceleration energy of the ion beam and the angle at which the ion beam is incident. Then, the semiconductor substrate and the substrate 700 which is provided with an insulating film 701 are attached to each other so that the insulating film 701 is sandwiched therebetween. After the semiconductor substrate and the substrate 700 are overlapped with each other, a pressure of, approximately, greater than or equal to 1 N/cm$^2$ and less than or equal to 500 N/cm$^2$, preferably greater than or equal to 11 N/cm$^2$ and less than or equal to 20 N/cm$^2$ is applied to part of the semiconductor substrate and the substrate 700 to attach both the substrates. When the pressure is applied, bonding between the semiconductor substrate and the insulating film 701 starts from the portion, which results in bonding of the entire surface where the semiconductor substrate and the insulating film 701 are in close contact with each other. Subsequently, heat treatment is performed, whereby microvoids that exist in the embrittled layer are combined, so that the volume of the microvoids increases. As a result, the single crystal semiconductor film which is part of the semiconductor substrate is separated from the semiconductor substrate along the embrittled layer. The heat treatment is performed at a temperature not exceeding the strain point of the substrate 700. Then, the single crystal semiconductor film is processed into a desired shape by etching or the like, so that an island-shaped semiconductor film 702 and an island-shaped semiconductor film 703 can be formed.

The photodiode 704 is formed using the island-shaped semiconductor film 702 over the insulating film 701, and the n-channel transistor 705 is formed using the island-shaped semiconductor film 703 over the insulating film 701. The photodiode 704 is a lateral junction type in which a region 727 having p-type conductivity, a region 728 having i-type conductivity, and a region 729 having n-type conductivity are formed in the island-shaped semiconductor film 702. The n-channel transistor 705 includes a gate electrode 707. In addition, the n-channel transistor 705 includes an insulating film 708 between the island-shaped semiconductor film 703 and the gate electrode 707.

Note that the region 728 having i-type conductivity refers to a region of the semiconductor film which contains an impurity imparting p-type or n-type conductivity at a concentration of $1 \times 10^{20}$ cm$^{-3}$ or less and has photoconductivity 100 or more times as high as dark conductivity. The region 728 having i-type conductivity includes, in its category, that which contains an impurity element belonging to Group 13 or Group 15 of the periodic table. That is, an i-type semiconductor has weak n-type electric conductivity when an impurity element for controlling valence electrons is not added intentionally. Therefore, the region 728 having i-type conductivity includes, in its category, that to which an impurity element imparting p-type conductivity is added intentionally or unintentionally at the same time of film formation or after the film formation.

Although there is no particular limitation on a substrate which can be used as the substrate 700, it is at least necessary that the substrate have heat resistance sufficient to withstand heat treatment performed later. For example, a glass substrate manufactured by a fusion method or a float method, a quartz substrate, a ceramic substrate, or the like can be used as the substrate 700. When the temperature of the heat treatment performed later is high, it is preferable that a substrate having a strain point of 730° C. or higher be used as the glass substrate. Further, a metal substrate such as a stainless-steel substrate or a substrate in which an insulating film is formed over the surface of a silicon substrate may be used as well. Although a substrate formed of a flexible synthetic resin such as plastic generally has a lower heat resistance temperature than the aforementioned substrates, it may be used as long as being resistant to a processing temperature during manufacturing steps.

Note that although the case where the photodiode 704 and the n-channel transistor 705 are formed using the single crystal semiconductor film is described as an example in this embodiment, the present invention is not limited to this structure. For example, a polycrystalline or microcrystalline semiconductor film which is formed over the insulating film 701 by a vapor deposition method may be used. Alternatively, the above semiconductor film may be formed by being crystallized by a known technique. Known crystallization techniques include a laser crystallization method using a laser beam and a crystallization method using a catalytic element. Alternatively, a combination of a crystallization method using a catalytic element and a laser crystallization method may be used. When a heat-resistant substrate such as a quartz substrate is used, it is possible to combine any of the following crystallization methods: a thermal crystallization method using an electrically heated furnace, a lamp annealing crystallization method using infrared light, a crystallization method using a catalytic element, and a high-temperature annealing method at approximately 950° C.

Further, in FIG. 14A, after a conductive film is formed over the insulating film 708, the conductive film is processed into a desired shape by etching or the like, whereby a wiring 711 as well as the gate electrode 707 is formed.

Next, as illustrated in FIG. 14A, an insulating film 712 is formed so as to cover the photodiode 704, the n-channel transistor 705, and the wiring 711. Note that although the case where a single-layer insulating film is used as the insulating film 712 is described as an example in this embodiment, the insulating film 712 is not necessarily a single-layer film and may be a stacked insulating film including two ore more layers.

The insulating film 712 is formed using a material which can withstand the temperature of heat treatment in a later manufacturing step. Specifically, it is preferable to use silicon oxide, silicon nitride, silicon nitride oxide, silicon oxynitride, aluminum nitride, aluminum oxide, or the like for the insulating film 712.

In this specification, an oxynitride refers to a substance in which the amount of oxygen is larger than that of nitrogen, and a nitride oxide refers to a substance in which the amount of nitrogen is larger than that of oxygen.

A surface of the insulating film 712 may be planarized by a CMP method or the like.

Next, as illustrated in FIG. 14A, a gate electrode 713 is formed over the insulating film 712.

The gate electrode 713 can be formed to have a single-layer structure or a stacked-layer structure using one or more conductive films including a metal material such as molybdenum, titanium, chromium, tantalum, tungsten, neodymium, or scandium or an alloy material which contains any of these metal materials as a main component, or a nitride of any of these metals. Note that aluminum or copper can also be used as such a metal material as long as it can withstand the temperature of heat treatment to be performed in a later step. Aluminum or copper is preferably used in combination with a refractory metal material in order to avoid problems with heat resistance and corrosion. As the refractory metal material, molybdenum, titanium, chromium, tantalum, tungsten, neodymium, scandium, or the like can be used.

For example, as a two-layer stacked structure of the gate electrode 713, the following structures are preferable: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; and a two-layer structure in which a titanium nitride film and a molybdenum film are stacked. As a three-layer stacked structure of the gate electrode 713, the following structure is preferable: a stacked structure including an aluminum film, an alloy film of aluminum and silicon, an alloy film of aluminum and titanium, or an alloy film of aluminum and neodymium as an intermediate layer and any of a tungsten film, a tungsten nitride film, a titanium nitride film, and a titanium film as a top layer and a bottom layer.

Further, a light-transmitting oxide conductive film of indium oxide, an alloy of indium oxide and tin oxide, an alloy of indium oxide and zinc oxide, zinc oxide, zinc aluminum oxide, zinc aluminum oxynitride, zinc gallium oxide, or the like can also be used as the gate electrode 713.

The thickness of the gate electrode 713 is in the range of 10 nm to 400 nm, preferably 100 nm to 200 nm. In this embodiment, after a conductive film for the gate electrode is formed to have a thickness of 150 nm by a sputtering method using a tungsten target, the conductive film is processed (patterned) into a desired shape by etching, whereby the gate electrode 713 is formed. The gate electrode preferably has a tapered end portion because coverage with a gate insulating film to be stacked thereover can be improved. Note that a resist mask may be formed by an inkjet method. Formation of the resist mask by an inkjet method requires no photomask; thus, manufacturing cost can be reduced.

Figure 14B:
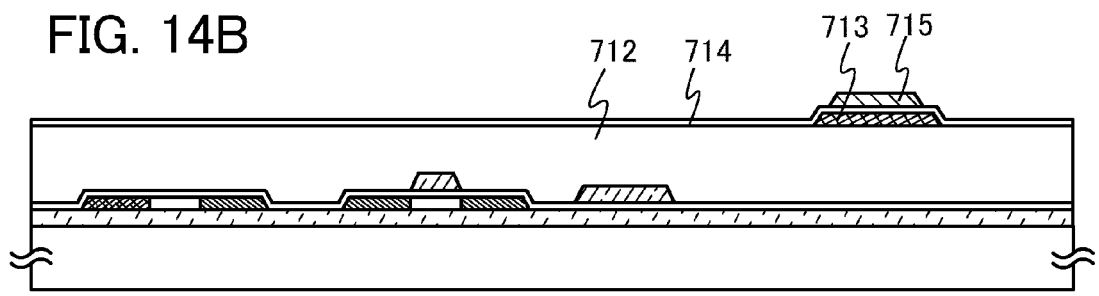

Next, as illustrated in FIG. 14B, a gate insulating film 714 is formed over the gate electrode 713. The gate insulating film 714 can be formed to have a single-layer structure or a stacked-layer structure using one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film formed by a plasma CVD method, a sputtering method, or the like. It is preferable that the gate insulating film 714 contains as little impurities such as moisture or hydrogen as possible. In the case of forming a silicon oxide film by a sputtering method, a silicon target or a quartz target is used as a target, and oxygen or a mixed gas of oxygen and argon is used as a sputtering gas.

An oxide semiconductor in which impurities are reduced (a purified oxide semiconductor) is extremely sensitive to an interface state and interface charge; therefore, the interface between the purified oxide semiconductor and the gate insulating film 714 is important. Accordingly, the gate insulating film (GI) which is in contact with the purified oxide semiconductor needs to have high quality.

For example, a high-quality insulating film which is dense and has high withstand voltage can be formed by a high density plasma CVD method using microwaves (with a frequency of 2.45 GHz), which is preferable. This is because when the purified oxide semiconductor and the high-quality gate insulating film are disposed in close contact with each other, interface states can be reduced and interface characteristics can be made favorable.

Needless to say, other film formation methods, such as a sputtering method or a plasma CVD method, can be employed as long as a high-quality insulating film can be formed as the gate insulating film 714. A gate insulating film whose film quality is improved, or an insulating film whose characteristics of an interface with the oxide semiconductor are improved, by heat treatment after the formation may be used. In any case, any insulating film that has a reduced interface state density and can form a favorable interface between the gate insulating film and the oxide semiconductor as well as having favorable film quality as a gate insulating film can be used.

The gate insulating film 714 may be formed to have a structure in which an insulating film formed using a material having a high barrier property and an insulating film having lower proportion of nitrogen, such as a silicon oxide film or a silicon oxynitride film, are stacked. In that case, the insulating film such as a silicon oxide film or a silicon oxynitride film is formed between the insulating film having a high barrier property and the oxide semiconductor film. As the insulating film having a high barrier property, a silicon nitride film, a silicon nitride oxide film, an aluminum nitride film, an aluminum nitride oxide film, or the like can be given, for example. The insulating film having a high barrier property can prevent impurities in an atmosphere, such as moisture or hydrogen, or impurities in the substrate, such as an alkali metal or a heavy metal, from entering the oxide semiconductor film, the gate insulating film 714, or the interface between the oxide semiconductor film and another insulating film and the vicinity thereof. In addition, the insulating film having a lower proportion of nitrogen, such as a silicon oxide film or a silicon oxynitride film, in contact with the oxide semiconductor film can prevent the insulating film having a high barrier property from being in direct contact with the oxide semiconductor film.

For example, the gate insulating film 714 may be formed to have a thickness of 100 nm in the following manner: a silicon nitride film ($SiN_y$ (y>0)) with a thickness of 50 nm or more and 200 nm or less is formed by a sputtering method as a first gate insulating film, and a silicon oxide film ($SiO_x$ (x>0)) with a thickness of 5 nm or more and 300 nm or less is stacked over the first gate insulating film as a second gate insulating film. The thickness of the gate insulating film 714 may be set as appropriate depending on characteristics needed for the transistor and may be about 350 nm to 400 nm.

In this embodiment, the gate insulating film 714 is formed to have a structure in which a silicon oxide film having a thickness of 100 nm formed by a sputtering method is stacked over a silicon nitride film having a thickness of 50 nm formed by a sputtering method.

Note that the gate insulating film 714 is in contact with the oxide semiconductor to be formed later. When hydrogen is contained in the oxide semiconductor, characteristics of the transistor are adversely affected; therefore, it is preferable that the gate insulating film 714 do not contain hydrogen, a hydroxyl group, and moisture. In order that the gate insulating film 714 contains as little hydrogen, hydroxyl group, and moisture as possible, it is preferable that an impurity adsorbed on the substrate 700, such as moisture or hydrogen, be eliminated and removed by preheating the substrate 700, over which the gate electrode 713 is formed, in a preheating chamber of a sputtering apparatus, as a pretreatment for film formation. The temperature for the preheating is in the range of 100° C. to 400° C., preferably 150° C. to 300° C. As an exhaustion unit provided in the preheating chamber, a cryopump is preferable. Note that this preheating treatment can be omitted.

Next, over the gate insulating film 714, an oxide semiconductor film having a thickness of 2 nm to 200 nm, preferably 3 nm to 50 nm, or more preferably 3 nm to 20 nm is formed. The oxide semiconductor film is formed by a sputtering method using an oxide semiconductor target. Moreover, the oxide semiconductor film can be formed by a sputtering method in a rare gas (e.g., argon) atmosphere, an oxygen atmosphere, or a mixed atmosphere of a rare gas (e.g., argon) and oxygen.

Note that before the oxide semiconductor film is formed by a sputtering method, reverse sputtering in which an argon gas is introduced and plasma is generated is preferably performed to remove dust from a surface of the gate insulating film 714. The reverse sputtering refers to a method in which, without application of voltage to a target side, an RF power source is used for application of voltage to a substrate side in an argon atmosphere to generate plasma in the vicinity of the substrate and modify a surface. Note that an atmosphere of nitrogen, helium, or the like may be used instead of an argon atmosphere. Alternatively, an argon atmosphere to which oxygen, nitrous oxide, or the like is added may be used. Alternatively, an argon atmosphere to which chlorine, carbon tetrafluoride, or the like is added may be used.

An oxide semiconductor to be used preferably contains at least indium (In) or zinc (Zn). In particular, In and Zn are preferably contained. As a stabilizer for reducing changes in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. As another stabilizer, one or plural kinds of lanthanoid such as lantern (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained. Specifically, for the oxide semiconductor film, as described above, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

In this embodiment, as the oxide semiconductor film, an In—Ga—Zn-based oxide semiconductor thin film with a thickness of 30 nm, which is obtained by a sputtering method using a target including indium (In), gallium (Ga), and zinc (Zn), is used. In the case of forming an In—Ga—Zn-based oxide semiconductor film by a sputtering method, it is preferable to use a target of an In—Ga—Zn-based oxide having an atomic ratio of In:Ga:Zn=1:1:1, 4:2:3, 3:1:2, 1:1:2, 2:1:3, or 3:1:4. When an oxide semiconductor film is formed using a target of an In—Ga—Zn-based oxide having the aforementioned atomic ratio, a polycrystal or a c-axis-aligned crystal (CAAC) is likely to be formed. The filling rate of the target including In, Ga, and Zn is greater than or equal to 90% and less than or equal to 100%, preferably greater than or equal to 95% and less than 100%. With the use of the target having high filling rate, a dense oxide semiconductor film is formed.

In the case where an In—Zn-based oxide material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn-based oxide semiconductor which has an atomic ratio of In:Zn:O=X:Y:Z, the relation of $Z>1.5X+Y$ is satisfied. The mobility can be improved by keeping the ratio of Zn within the above range.

In this embodiment, the oxide semiconductor film is formed over the substrate 700 in such a manner that the substrate is held in a treatment chamber kept at reduced pressure, a sputtering gas from which hydrogen and moisture are removed is introduced into the treatment chamber while residual moisture therein is removed, and the above target is used. The substrate temperature in film formation may be in the range of 100° C. to 600° C., preferably 200° C. to 400° C. By forming the oxide semiconductor film in a state where the substrate is heated, the concentration of impurities included in the formed oxide semiconductor film can be reduced. In addition, damage by sputtering can be reduced. In order to remove residual moisture in the treatment chamber, an entrapment vacuum pump is preferably used. For example, a cryopump, an ion pump, or a titanium sublimation pump is preferably used. The exhaustion unit may be a turbo pump provided with a cold trap. In the film formation chamber which is exhausted with a cryopump, for example, a hydrogen atom, a compound containing a hydrogen atom, such as water ($H_2O$), (preferably, also a compound containing a carbon atom), and the like are removed, whereby the concentration of an impurity contained in the oxide semiconductor film formed in the film formation chamber can be reduced.

As one example of the film formation conditions, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power source is preferable because dust generated in film formation can be reduced and the film thickness can be made uniform.

In order that the oxide semiconductor film contains as little hydrogen, hydroxyl group, and moisture as possible, it is preferable that an impurity adsorbed on the substrate 700, such as moisture or hydrogen, be eliminated and removed by preheating the substrate 700 which has been subjected to the process up to and including the step of forming the gate insulating film 714, in a preheating chamber of a sputtering apparatus, as a pretreatment for film formation. The temperature for the preheating is in the range of 100° C. to 400° C., preferably 150° C. to 300° C. As an exhaustion unit provided in the preheating chamber, a cryopump is preferable. Note that this preheating treatment can be omitted. This preheating may be similarly performed on the substrate 700 which has been subjected to the process up to and including the step of forming conductive films 716 to 721, before the formation of an insulating film 722 which will be formed later.

Next, as illustrated in FIG. 14B, the oxide semiconductor film is processed (patterned) into a desired shape by etching or the like, whereby an island-shaped oxide semiconductor film 715 is formed over the gate insulating film 714 in a position where the island-shaped oxide semiconductor film 715 overlaps with the gate electrode 713.

A resist mask for forming the island-shaped oxide semiconductor film 715 may be formed by an inkjet method. Formation of the resist mask by an inkjet method requires no photomask; thus, manufacturing cost can be reduced.

Note that etching for forming the island-shaped oxide semiconductor film 715 may be wet etching, dry etching, or both dry etching and wet etching. As the etching gas for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel-plate reactive ion etching (RIE) method or an inductively coupled plasma (ICP) etching method can be used. In order to etch the film into a desired shape, etching conditions (e.g., the amount of electric power applied to a coiled electrode, the amount of electric power applied to an electrode on the substrate side, and the electrode temperature on the substrate side) need to be set as appropriate.

As an etchant for wet etching, ITO-07N (produced by KANTO CHEMICAL CO., INC.) may be used.

Note that it is preferable that reverse sputtering be performed before the formation of a conductive film in a subsequent step so that a resist residue or the like left over surfaces of the island-shaped oxide semiconductor film 715 and the gate insulating film 714 is removed.

Note that, in some cases, the oxide semiconductor film formed by sputtering or the like includes a large amount of moisture or hydrogen as impurities. Moisture and hydrogen easily form a donor level and thus serve as impurities in the oxide semiconductor. Thus, in one embodiment of the present invention, in order to reduce an impurity such as moisture or hydrogen in the oxide semiconductor film, heat treatment is performed on the oxide semiconductor film 715 in a nitrogen atmosphere, an oxygen atmosphere, an atmosphere of ultra-dry air, or a rare gas (e.g., argon, helium) atmosphere. It is preferable that the water content in the gas be 20 ppm or less, preferably 1 ppm or less, further preferably 10 ppb or less.

By performing heat treatment on the oxide semiconductor film 715, moisture or hydrogen in the oxide semiconductor film 715 can be eliminated. Specifically, heat treatment may be performed at a temperature of 300° C. to 700° C., preferably 300° C. to 500° C. For example, heat treatment may be performed at 500° C. for approximately 3 to 6 minutes. When an RTA method is used for the heat treatment, dehydration or dehydrogenation can be performed in a short time; therefore, treatment can be performed even at a temperature higher than the strain point of a glass substrate.

In this embodiment, an electrical furnace that is one of heat treatment apparatuses is used.

Note that a heat treatment apparatus is not limited to an electrical furnace, and may include a device for heating a process object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

In the heat treatment, it is preferable that moisture, hydrogen, or the like be not contained in nitrogen or a rare gas such as helium, neon, or argon. Alternatively, the purity of nitrogen or a rare gas such as helium, neon, or argon introduced into a heat treatment apparatus is preferably set to 6N (99.9999%) or more, more preferably 7N (99.99999%) or more (i.e., the impurity concentration is 1 ppm or less, preferably 0.1 ppm or less).

Through the above-described process, the concentration of hydrogen in the oxide semiconductor film 715 can be reduced and the oxide semiconductor film 715 can be purified. Thus, the oxide semiconductor film can be stabilized. In addition, heat treatment at a temperature of lower than or equal to the glass transition temperature makes it possible to form an oxide semiconductor film with a wide band gap in which the density of carriers generated due to hydrogen is low. Therefore, the transistor can be manufactured using a large-sized substrate, so that the productivity can be increased.

Note that in the case where the oxide semiconductor film is heated, although depending on a material of the oxide semiconductor film or heating conditions, plate-like crystals are formed at the surface of the oxide semiconductor film in some cases. The plate-like crystal is preferably a single crystal which is c-axis-aligned in a direction substantially perpendicular to a surface of the oxide semiconductor film. Even if the plate-like crystals do not form a single crystal body, each crystal is preferably a polycrystalline body which is c-axis-aligned in a direction substantially perpendicular to the surface of the oxide semiconductor film. In the above-described polycrystalline body, in addition to being c-axisaligned, the crystals preferably have identical a-b planes, a-axes, or b-axes. Note that when a base surface of the oxide semiconductor film is uneven, a plane-like crystal is a polycrystalline body. Therefore, the surface of the base is preferably as even as possible.

Next, the insulating film 708, the insulating film 712, and the gate insulating film 714 are partly etched, whereby contact holes reaching the island-shaped semiconductor film 702, the island-shaped semiconductor film 703, and the wiring 711 are formed.

Figure 14C:
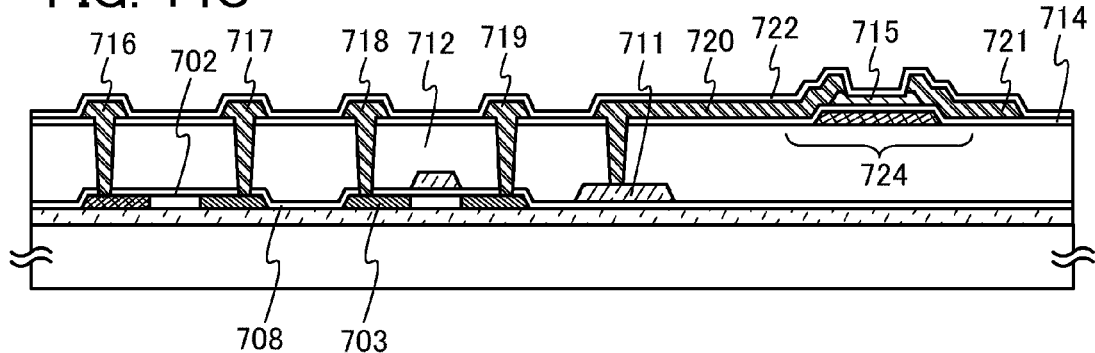

Then, a conductive film is formed so as to cover the oxide semiconductor film 715 by a sputtering method or a vacuum evaporation method. After that, the conductive film is patterned by etching or the like, so that the conductive films 716 to 721 which each function as a source electrode, a drain electrode, or a wiring are formed as illustrated in FIG. 14C.

Note that the conductive films 716 and 717 are in contact with the island-shaped semiconductor film 702. The conductive films 718 and 719 are in contact with the island-shaped semiconductor film 703. The conductive film 720 is in contact with the wiring 711 and the oxide semiconductor film 715. The conductive film 721 is in contact with the oxide semiconductor film 715.

As a material of the conductive film for forming the conductive films 716 to 721, any of the following materials can be used: an element selected from aluminum, chromium, copper, tantalum, titanium, molybdenum, or tungsten; an alloy including any of these elements; an alloy film including the above elements in combination; or the like. Alternatively, a structure may be employed in which a film of a refractory metal such as chromium, tantalum, titanium, molybdenum, or tungsten is stacked over or under a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film may have a single-layer structure or a stacked-layer structure including two or more layers. For example, a single-layer structure of an aluminum film containing silicon; a two-layer structure including a titanium film over an aluminum film; a three-layer structure in which a titanium film, an aluminum film, and a titanium film are stacked in this order; and the like can be given.

The conductive film for forming the conductive films 716 to 721 may be formed using a conductive metal oxide. As the conductive metal oxide, indium oxide, tin oxide, zinc oxide, an alloy of indium oxide and tin oxide, an alloy of indium oxide and zinc oxide, or any of the metal oxide materials containing silicon or silicon oxide can be used.

In the case where heat treatment is performed after formation of the conductive film, the conductive film preferably has heat resistance sufficient to withstand the heat treatment.

Note that the material and etching conditions are adjusted as appropriate so that the oxide semiconductor film 715 is not removed in etching of the conductive film as much as possible. Depending on the etching conditions, there are some cases in which an exposed portion of the island-shaped oxide semiconductor film 715 is partly etched and thus a groove (a depression portion) is formed.

In this embodiment, a titanium film is used as the conductive film. Therefore, the conductive film can be selectively etched by wet etching by using a solution (an ammonia hydrogen peroxide mixture) containing ammonia and hydrogen peroxide water; however, the oxide semiconductor film 715 is also partly etched in some cases. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, the conductive film may be etched by dry etching by using a gas containing chlorine ($Cl_2$), boron trichloride ($BCl_3$), or the like.

In order to reduce the number of photomasks and steps in a photolithography process, etching may be performed with the use of a resist mask formed using a multi-tone mask which is a light-exposure mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography steps can also be reduced, whereby simplification of the process can be realized.

Next, plasma treatment is performed using a gas such as $N_2O$, $N_2$, or Ar. By this plasma treatment, water or the like adhering to an exposed surface of the oxide semiconductor film is removed. Plasma treatment may be performed using a mixture gas of oxygen and argon as well.

After the plasma treatment, as illustrated in FIG. 14C, the insulating film 722 is formed so as to cover the conductive films 716 to 721 and the oxide semiconductor film 715. The insulating film 722 preferably contains as little impurities such as moisture, hydrogen, and oxygen as possible. An insulating film of a single layer or a plurality of insulating films stacked may be employed as the insulating film 722. When hydrogen is contained in the insulating film 722, entry of the hydrogen into the oxide semiconductor film or extraction of oxygen from the oxide semiconductor film by the hydrogen occurs, whereby a back channel portion of the oxide semiconductor film has lower resistance (n-type conductivity); thus, a parasitic channel might be formed. Therefore, it is important that a film formation method in which hydrogen is not used be employed in order to form the insulating film 722 containing as little hydrogen as possible. A material having a high barrier property is preferably used for the insulating film 722. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having a lower proportion of nitrogen such as a silicon oxide film or a silicon oxynitride film is formed on the side closer to the oxide semiconductor film 715 than the insulating film having a high barrier property. Then, the insulating film having a high barrier property is formed so as to overlap with the conductive films 716 to 721 and the oxide semiconductor film 715 with the insulating film having a lower proportion of nitrogen sandwiched therebetween. When the insulating film having a high barrier property is used, impurities such as moisture or hydrogen can be prevented from entering the oxide semiconductor film 715, the gate insulating film 714, or the interface between the oxide semiconductor film 715 and another insulating film and the vicinity thereof. In addition, the insulating film having a lower proportion of nitrogen such as a silicon oxide film or a silicon oxynitride film formed in contact with the oxide semiconductor film 715 can prevent the insulating film formed using a material having a high barrier property from being in direct contact with the oxide semiconductor film 715.

In this embodiment, the insulating film 722 is formed to have a structure in which a silicon nitride film having a thickness of 100 nm formed by a sputtering method is stacked over a silicon oxide film having a thickness of 200 nm formed by a sputtering method. The substrate temperature in film formation may be higher than or equal to room temperature and lower than or equal to 300° C., and is 100° C. in this embodiment.

After the insulating film 722 is formed, heat treatment may be performed. The heat treatment is performed in a nitrogen atmosphere, an atmosphere of ultra-dry air, or a rare gas (e.g., argon, helium) atmosphere preferably at a temperature in the range of 200° C. to 400° C., for example, 250° C. to 350° C. It is preferable that the water content in the gas be 20 ppm or less, preferably 1 ppm or less, further preferably 10 ppb or less. In this embodiment, for example, heat treatment is performed at 250° C. in a nitrogen atmosphere for 1 hour. Furthermore, RTA treatment for a short time at a high temperature may be performed before the formation of the conductive films 716 to 721 in a manner similar to that of the previous heat treatment performed on the oxide semiconductor film to reduce moisture or hydrogen. Even when oxygen defects are generated in the oxide semiconductor film 715 by the previous heat treatment performed on the oxide semiconductor film by performing heat treatment after providing the insulating film 722 containing oxygen, oxygen is supplied to the oxide semiconductor film 715 from the insulating film 722. By supplying oxygen to the oxide semiconductor film 715, oxygen defects that serve as donors can be reduced in the oxide semiconductor film 715 and the stoichiometric ratio can be satisfied. It is preferable that the proportion of oxygen in the oxide semiconductor film 715 be higher than that in the stoichiometric composition. As a result, the oxide semiconductor film 715 can be made to be substantially i-type and variation in electrical characteristics of the transistor due to oxygen defects can be reduced; thus, electrical characteristics can be improved. The timing of this heat treatment is not particularly limited as long as it is after the formation of the insulating film 722. When this heat treatment doubles as another step such as heat treatment for formation of a resin film or heat treatment for reduction of the resistance of a transparent conductive film, the oxide semiconductor film 715 can be made to be substantially i-type without the number of steps increased.

Moreover, the oxygen defects that serve as donors in the oxide semiconductor film 715 may be reduced by subjecting the oxide semiconductor film 715 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor film 715 by an ion implantation method, an ion doping method, or the like to reduce oxygen defects serving as donors. For example, oxygen which is made into a plasma state with a microwave at 2.45 GHz may be added to the oxide semiconductor film 715.

Note that a back gate electrode may be formed in a position overlapping with the oxide semiconductor film 715 by forming a conductive film over the insulating film 722 and then patterning the conductive film. In the case where the back gate electrode is formed, an insulating film is preferably formed to cover the back gate electrode. The back gate electrode can be formed using a material and a structure similar to those of the gate electrode 713 or the conductive films 716 to 721.

The thickness of the back gate electrode is in the range of 10 nm to 400 nm, preferably 100 nm to 200 nm. For example, the back gate electrode may be formed in a such a manner that a conductive film in which a titanium film, an aluminum film, and a titanium film are stacked is formed, a resist mask is formed by a photolithography method or the like, and unnecessary portions are removed by etching so that the conductive film is processed (patterned) into a desired shape.

Through the above-described process, a transistor 724 is formed.

The transistor 724 includes the gate electrode 713, the gate insulating film 714 over the gate electrode 713, the oxide semiconductor film 715 which is over the gate insulating film 714 and overlaps with the gate electrode 713, and a pair of the conductive films 720 and 721 formed over the oxide semiconductor film 715. Further, the transistor 724 may include the insulating film 722 as its component. The transistor 724 illustrated in FIG. 14C has a channel-etched structure in which part of the oxide semiconductor film 715 between the conductive film 720 and the conductive film 721 is etched.

Although the transistor 724 is described as a single-gate transistor, a multi-gate transistor including a plurality of channel formation regions can be manufactured when a plurality of gate electrodes 713 electrically connected to each other is included, if needed.

This embodiment can be implemented in combination with any of the above-described embodiments.

(Embodiment 4)

In this embodiment, a transistor which includes an oxide semiconductor and has a structure different from that in Embodiment 3 will be described.

Figure 15A:
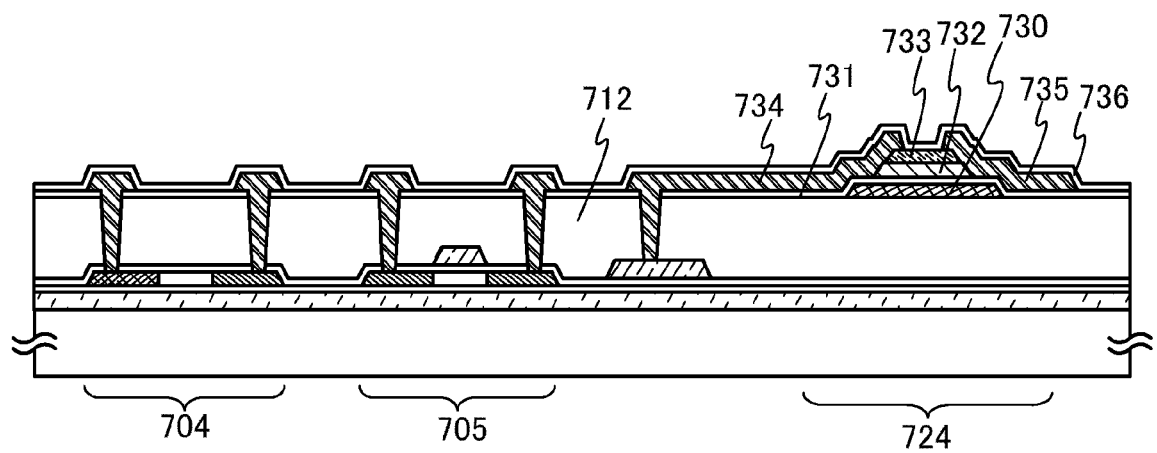
FIGS. 15A and 15B are cross-sectional views of a transistor including silicon and a transistor including an oxide semiconductor.

A solid-state imaging device or a semiconductor display device illustrated in FIG. 15A includes the photodiode 704 and the n-channel transistor 705 as in Embodiment 3. In addition, a bottom-gate transistor 724 which includes an oxide semiconductor film and has a channel-protective structure is formed over the photodiode 704 and the n-channel transistor 705 in FIG. 15A.

The transistor 724 includes a gate electrode 730 formed over the insulating film 712, a gate insulating film 731 over the gate electrode 730, an oxide semiconductor film 732 over the gate insulating film 731 and overlapping with the gate electrode 730, a channel protective film 733 over the oxide semiconductor film 732 and in a position overlapping with the gate electrode 730, a conductive film 734 and a conductive film 735 formed over the oxide semiconductor film 732. The transistor 724 may further include, as its component, an insulating film 736 formed over the conductive film 734, the conductive film 735, and the channel protective film 733.

The channel protective film 733 can prevent a portion of the oxide semiconductor film 732, which serves as a channel formation region, from being damaged in a later step, for example, a reduction in thickness due to plasma or an etchant in etching. Therefore, reliability of the transistor can be improved.

The channel protective film 733 can be formed using an inorganic material containing oxygen (such as silicon oxide, silicon nitride oxide, silicon oxynitride, aluminum oxide, aluminum nitride oxide). The channel protective film 733 can be formed by a vapor deposition method such as a plasma CVD method or a thermal CVD method, or a sputtering method. After the formation of the channel protective film 733, the shape thereof is processed by etching. Here, the channel protective film 733 is formed in such a manner that a silicon oxide film is formed by a sputtering method and processed by etching using a mask formed by photolithography.

An inorganic material containing oxygen is used for the channel protective film 733, whereby a structure can be provided in which oxygen is supplied from the channel protective film 733 to the oxide semiconductor film 732 and oxygen defects serving as donors are reduced to satisfy the stoichiometric composition even when the oxygen defects are generated in the oxide semiconductor film 732 by heat treatment performed to reduce moisture or hydrogen. It is preferable that the proportion of oxygen in the oxide semiconductor film 732 be higher than that in the stoichiometric composition. Thus, the channel formation region can be made to be close to i-type and a variation in electrical characteristics of the transistor 724 due to oxygen defects can be reduced; accordingly, the electrical characteristics can be improved.

Figure 15B:
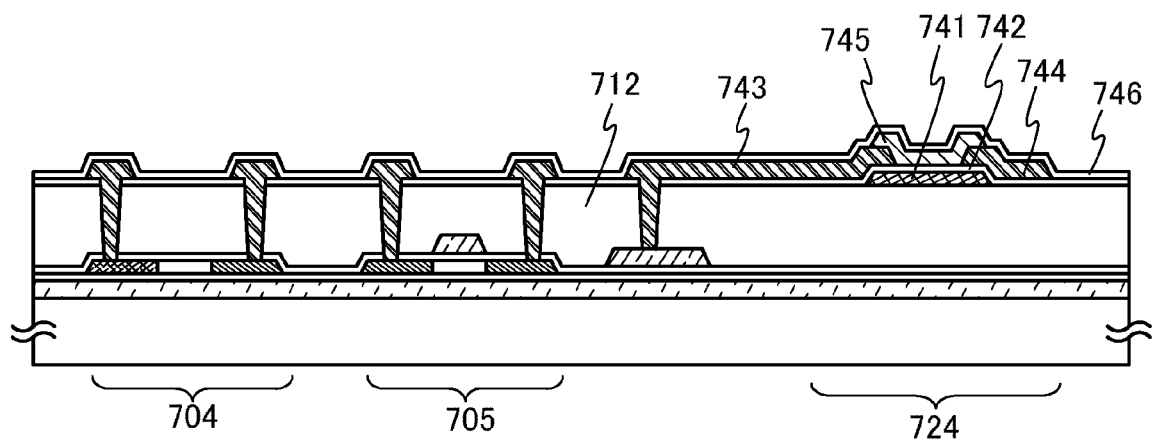

A solid-state imaging device or a semiconductor display device illustrated in FIG. 15B includes a photodiode 704 including crystalline silicon and an n-channel transistor 705 as in Embodiment 3. In addition, a bottom-contact transistor 724 including an oxide semiconductor film is formed over the photodiode 704 and the n-channel transistor 705 in FIG. 15B.

The transistor 724 includes a gate electrode 741 formed over the insulating film 712, a gate insulating film 742 over the gate electrode 741, a conductive film 743 and a conductive film 744 over the gate insulating film 742, and an oxide semiconductor film 745 overlapping with the gate electrode 741 with the gate insulating film 742 sandwiched therebetween. The transistor 724 may further include, as its component, an insulating film 746 formed over the oxide semiconductor film 745.

Note that the transistor 724 described in this embodiment may further include a back gate electrode.

This embodiment can be implemented in combination with any of the above-described embodiments.

(Embodiment 5)

In this embodiment, structural examples of a transistor will be described. Note that the same portions as those in the above embodiments or the portions having functions similar to those in the above embodiments can be formed in a manner similar to those of the above embodiments. The same steps as those in the above embodiments and steps similar to those in the above embodiments can be conducted in a manner similar to those of the above embodiments. Therefore, the descriptions thereof are not repeated in this embodiment. In addition, detailed description of the same portion is not repeated, either.

Figure 19A:
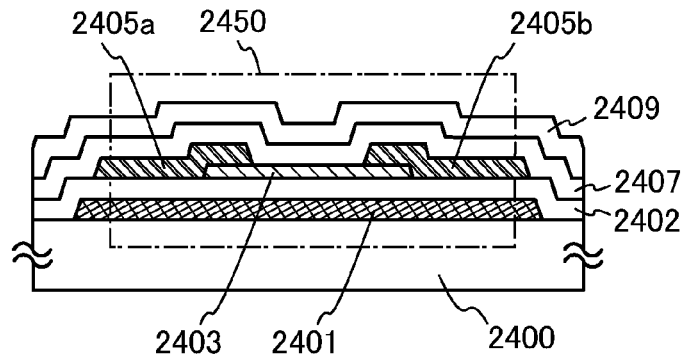
FIGS. 19A to 19D are diagrams each illustrating an example of a structure of a transistor.

A transistor 2450 illustrated in FIG. 19A includes a gate electrode 2401 over a substrate 2400, a gate insulating film 2402 over the gate electrode 2401, an oxide semiconductor film 2403 over the gate insulating film 2402, and a source electrode 2405a and a drain electrode 2405b over the oxide semiconductor film 2403. An insulating film 2407 is formed over the oxide semiconductor film 2403, the source electrode 2405a, and the drain electrode 2405b. An insulating film 2409 may be formed over the insulating film 2407. The transistor 2450 is a bottom-gate transistor and is also an inverted staggered transistor.

Figure 19B:
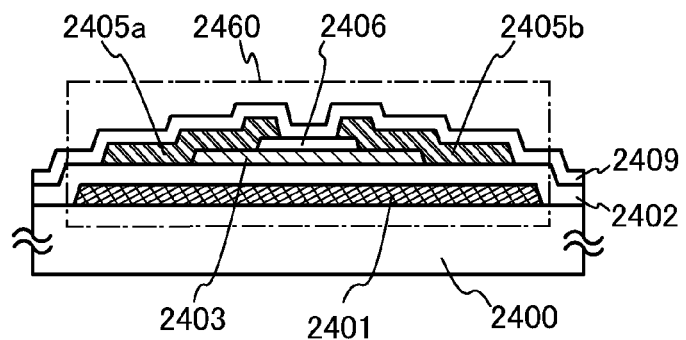

A transistor 2460 illustrated in FIG. 19B includes a gate electrode 2401 over a substrate 2400, a gate insulating film 2402 over the gate electrode 2401, an oxide semiconductor film 2403 over the gate insulating film 2402, a channel protective film 2406 over the oxide semiconductor film 2403, and a source electrode 2405a and a drain electrode 2405b over the channel protective film 2406 and the oxide semiconductor film 2403. An insulating film 2409 may be formed over the source electrode 2405a and the drain electrode 2405b. The transistor 2460 is a bottom-gate transistor called a channel-protective type (also referred to as a channel-stop type) transistor and is also an inverted staggered transistor. The channel protective film 2406 can be formed using a material and a method similar to those of other insulating films.

Figure 19C:
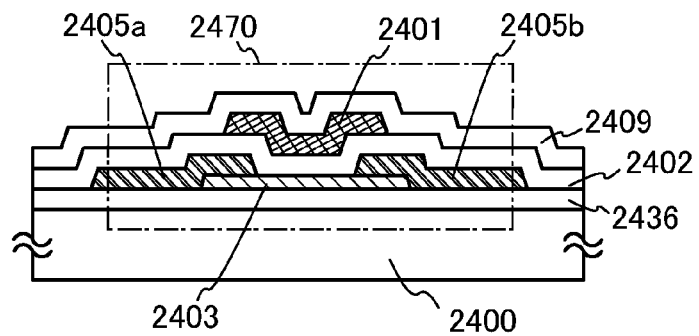

A transistor 2470 illustrated in FIG. 19C includes a base film 2436 over a substrate 2400, an oxide semiconductor film 2403 over the base film 2436, a source electrode 2405a and a drain electrode 2405b over the oxide semiconductor film 2403 and the base film 2436, a gate insulating film 2402 over the oxide semiconductor film 2403, the source electrode 2405a, and the drain electrode 2405b, and a gate electrode 2401 over the gate insulating film 2402. An insulating film 2409 may be formed over the gate electrode 2401. The transistor 2470 is a top-gate transistor.

Figure 19D:
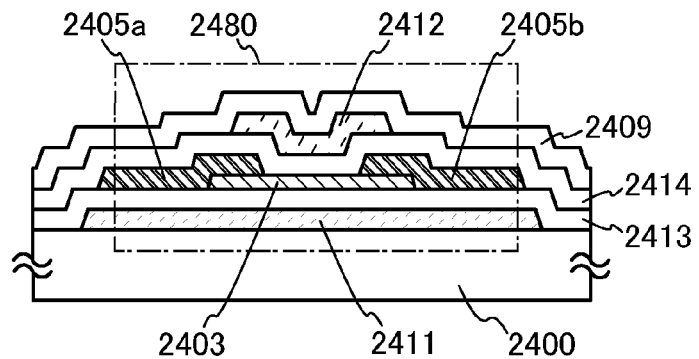

A transistor 2480 illustrated in FIG. 19D includes a gate electrode 2411 over a substrate 2400, a first gate insulating film 2413 over the gate electrode 2411, an oxide semiconductor film 2403 over the first gate insulating film 2413, and a source electrode 2405a and a drain electrode 2405b over the oxide semiconductor film 2403 and the first gate insulating film 2413. A second gate insulating film 2414 is formed over the oxide semiconductor film 2403, the source electrode 2405a, and the drain electrode 2405b, and a back gate electrode 2412 is formed over the second gate insulating film 2414. An insulating film 2409 may be formed over the back gate electrode 2412.

The transistor 2480 has a structure which is a combination of the transistor 2450 and the transistor 2470.

By changing the potential of the back gate electrode, the threshold voltage of the transistor can be changed. The back gate electrode is formed so as to overlap with a channel formation region in the oxide semiconductor film 2403. Further, the back gate electrode may be electrically insulated and in a floating state, or may be in a state where the back gate electrode is supplied with a potential. In the latter case, the back gate electrode may be supplied with a potential at the same level as that of the gate electrode, or may be supplied with a fixed potential such as a ground potential. By controlling the level of the potential supplied to the back gate electrode, the threshold voltage of the transistor can be controlled.

When the oxide semiconductor film 2403 is completely covered with the back gate electrode, the source electrode 2405a, and the drain electrode 2405b, light from the back gate electrode side can be prevented from entering the oxide semiconductor film 2403. Therefore, photodegradation of the oxide semiconductor film 2403 can be prevented and deterioration of characteristics such as a shift of the threshold voltage of the transistor can be prevented.

Insulating films in contact with the oxide semiconductor film 2403 (in this embodiment, corresponding to the gate insulating film 2402, the insulating film 2407, the channel protective film 2406, the base film 2436, the first gate insulating film 2413, and the second gate insulating film 2414) are preferably formed using an insulating material containing a Group 13 element and oxygen. Many of oxide semiconductor materials contain a Group 13 element, and an insulating material containing a Group 13 element works well with oxide semiconductors. By using an insulating material containing a Group 13 element for an insulating film in contact with the oxide semiconductor, an interface with the oxide semiconductor can keep a favorable state.

An insulating material containing a Group 13 element refers to an insulating material containing one or more Group 13 elements. As the insulating material containing a Group 13 element, gallium oxide, aluminum oxide, aluminum gallium oxide, gallium aluminum oxide, or the like can be given as an example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor film containing gallium, a material containing gallium oxide may be used for an insulating film, so that favorable characteristics can be kept at the interface between the oxide semiconductor film and the insulating film. When the oxide semiconductor film and the insulating film containing gallium oxide are provided in contact with each other, pile-up of hydrogen at the interface between the oxide semiconductor film and the insulating film can be suppressed, for example. Note that a similar effect can be obtained in the case where an element belonging to the same group as a constituent element of the oxide semiconductor is used for an insulating film. For example, it is effective to form an insulating film with the use of a material containing aluminum oxide. Note that aluminum oxide has a property of not easily transmitting water. Thus, it is preferable to use a material containing aluminum oxide in terms of preventing entry of water into the oxide semiconductor film.

The insulating material of the insulating film in contact with the oxide semiconductor film 2403 is preferably made to contain oxygen in a proportion higher than that in the stoichiometric composition by heat treatment in an oxygen atmosphere or by oxygen doping. "Oxygen doping" refers to adding oxygen into a bulk. Note that the term "bulk" is used in order to clarify that oxygen is added not only to a surface of a thin film but also to the inside of the thin film. In addition, "oxygen doping" includes oxygen plasma doping in which oxygen plasma is added to a bulk. The oxygen doping may be performed by an ion implantation method or an ion doping method.

For example, in the case where the insulating film in contact with the oxide semiconductor film 2403 is formed using gallium oxide, the composition of gallium oxide can be set to be $Ga_2O_x$ ($x=3+\alpha$, $0<\alpha<1$) by heat treatment in an oxygen atmosphere or by oxygen doping.

In the case where the insulating film in contact with the oxide semiconductor film 2403 is formed using aluminum oxide, the composition of aluminum oxide can be set to be $Al_2O_x$ ($x=3+\alpha$, $0<\alpha<1$) by heat treatment in an oxygen atmosphere or by oxygen doping.

In the case where the insulating film in contact with the oxide semiconductor film 2403 is formed using gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or by oxygen doping.

By oxygen doping, an insulating film which includes a region where the proportion of oxygen is higher than that in the stoichiometric composition can be formed. When the insulating film including such a region is in contact with the oxide semiconductor film, excess oxygen in the insulating film is supplied to the oxide semiconductor film, and oxygen defects in the oxide semiconductor film or at an interface between the oxide semiconductor film and the insulating film are reduced. Thus, the oxide semiconductor film can be made to be an i-type or substantially i-type oxide semiconductor.

Note that the insulating film which includes a region where the proportion of oxygen is higher than that in the stoichiometric composition may be applied to either the insulating film located on the upper side of the oxide semiconductor film or the insulating film located on the lower side of the oxide semiconductor film of the insulating films in contact with the oxide semiconductor film 2403; however, it is preferable to apply such an insulating film to both of the insulating films in contact with the oxide semiconductor film 2403. The above-described effect can be enhanced with a structure where the oxide semiconductor film 2403 is sandwiched between the insulating films which each include a region where the proportion of oxygen is higher than that in the stoichiometric composition, which are used as the insulating films in contact with the oxide semiconductor film 2403 and located on the upper side and the lower side of the oxide semiconductor film 2403.

The insulating films on the upper side and the lower side of the oxide semiconductor film 2403 may contain the same constituent elements or different constituent elements. For example, the insulating films on the upper side and the lower side may be both formed using gallium oxide whose composition is $Ga_2O_x$ ($x=3+\alpha$, $0<\alpha<1$). Alternatively, one of the insulating films on the upper side and the lower side may be formed using $Ga_2O_x$ ($x=3+\alpha$, $0<\alpha<1$) and the other may be formed using aluminum oxide whose composition is $Al_2O_x$ ($x=3+\alpha$, $0<\alpha<1$).

The insulating film in contact with the oxide semiconductor film 2403 may be formed by stacking insulating films which each include a region where the proportion of oxygen is higher than that in the stoichiometric composition. For example, the insulating film on the upper side of the oxide semiconductor film 2403 may be formed as follows: gallium oxide whose composition is $Ga_2O_x$ ($x=3+\alpha$, $0<\alpha<1$) is formed and gallium aluminum oxide (aluminum gallium oxide) whose composition is $Ga_xAl_{2-x}O_{3+\alpha}$ ($0<x<2$, $0<\alpha<1$) is formed thereover. Note that the insulating film on the lower side of the oxide semiconductor film 2403 may be formed by stacking insulating films which each include a region where the proportion of oxygen is higher than that in the stoichiometric composition. Further, both of the insulating films on the upper side and the lower side of the oxide semiconductor film 2403 may be formed by stacking insulating films which each include a region where the proportion of oxygen is higher than that in the stoichiometric composition.

This embodiment can be implemented in combination with any of the above-described embodiments.

EXAMPLE 1

In this example, the arrangement of a panel and a backlight in a semiconductor display device according to one embodiment of the present invention will be described.

FIG. 17 is an example of a perspective view illustrating a structure of a semiconductor display device according to one embodiment of the present invention. The semiconductor display device illustrated in FIG. 17 includes a panel 1601 in which a pixel including a display element and a photosensor is formed between a pair of substrates, a first diffuser plate 1602, a prism sheet 1603, a second diffuser plate 1604, a light guide plate 1605, a reflective plate 1606, a backlight 1608 including a plurality of light sources 1607, and a circuit board 1609.

The panel 1601, the first diffuser plate 1602, the prism sheet 1603, the second diffuser plate 1604, the light guide plate 1605, and the reflective plate 1606 are sequentially stacked. The light sources 1607 are provided at an end portion of the light guide plate 1605. Light from the light source 1607 is diffused inside the light guide plate 1605 and is uniformly delivered to the panel 1601 from the counter substrate side with the help of the first diffuser plate 1602, the prism sheet 1603, and the second diffuser plate 1604.

Although the first diffuser plate 1602 and the second diffuser plate 1604 are used in this example, the number of diffuser plates is not limited thereto. The number of diffuser plates may be one, or may be three or more. The diffuser plate may be provided between the light guide plate 1605 and the panel 1601. Therefore, the diffuser plate may be provided only on the side closer to the panel 1601 than the prism sheet 1603, or may be provided only on the side closer to the light guide plate 1605 than the prism sheet 1603.

Further, the cross section of the prism sheet 1603 is not limited to a sawtooth shape illustrated in FIG. 17. The prism sheet 1603 may have any shape as long as light from the light guide plate 1605 can be concentrated on the panel 1601 side.

The circuit board 1609 is provided with a circuit for generating or processing various signals to be input to the panel 1601, a circuit for processing various signals output from the panel 1601, and the like. In addition, the circuit board 1609 and the panel 1601 are connected to each other via a flexible printed circuit (FPC) 1611 in FIG. 17. Note that the above circuit may be connected to the panel 1601 by a chip on glass (COG) method, or part of the above circuit may be connected to the FPC 1611 by a chip on film (COF) method.

FIG. 17 illustrates an example in which a control circuit for controlling the driving of the light sources 1607 is provided for the circuit board 1609, and the control circuit and the light sources 1607 are connected to each other via an FPC 1610. Note that the above-described control circuit may be formed in the panel 1601, in which case the panel 1601 and the light sources 1607 are connected to each other via an FPC or the like.

The plurality of light sources 1607 emits light of different colors. As the light sources 1607, light-emitting elements such as an LED (Light Emitting Diode) or an OLED (Organic Light Emitting Diode) can be used.

Although FIG. 17 illustrates an edge-light type light source in which the light sources 1607 are provided at an end portion of the panel 1601, a semiconductor display device according to one embodiment of the present invention may be a direct-below type in which the light sources 1607 are provided directly below the panel 1601.

For example, when a finger 1612 which is an object to be detected is placed close to the panel 1601, part of light that has been emitted from the backlight 1608 and passed through the panel 1601 reflects off the finger 1612 and enters the panel 1601 again. Color image data of the finger 1612 which is the object to be detected can be obtained by sequentially turning on the light sources 1607 corresponding to individual colors and obtaining image data of every color.

This example can be implemented in combination with any of the above-described embodiments.

EXAMPLE 2

Features of a solid-state imaging device or a semiconductor display device according to one embodiment of the present invention are that high-resolution image data can be obtained because FS operation is performed, and that high-quality image data of a moving object can also be obtained because a global shutter method is employed. Therefore, an electronic device including the solid-state imaging device or the semiconductor display device according to one embodiment of the present invention can be equipped with a more highly functional application by additionally including the solid-state imaging device or the semiconductor display device as a component. Another feature of a solid-state imaging device or a semiconductor display device according to one embodiment of the present invention is that power consumption is low because FS operation is performed. Therefore, an electronic device including the solid-state imaging device or the semiconductor display device according to one embodiment of the present invention can be made to consume less power by additionally including the solid-state imaging device or the semiconductor display device as a component.

The solid-state imaging device or the semiconductor device according to one embodiment of the present invention can be used for display devices, notebook personal computers, or image reproducing devices provided with recording media (typically, devices which reproduce the content of recording media such as digital versatile discs (DVDs) and have displays for displaying the reproduced images). Other examples of electronic devices which can be provided with the solid-state imaging device or the semiconductor display device according to one embodiment of the present invention include mobile phones, portable game machines, portable information terminals, electronic books, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like. FIGS. 18A to 18E illustrate specific examples of these electronic devices.

Figure 18A:
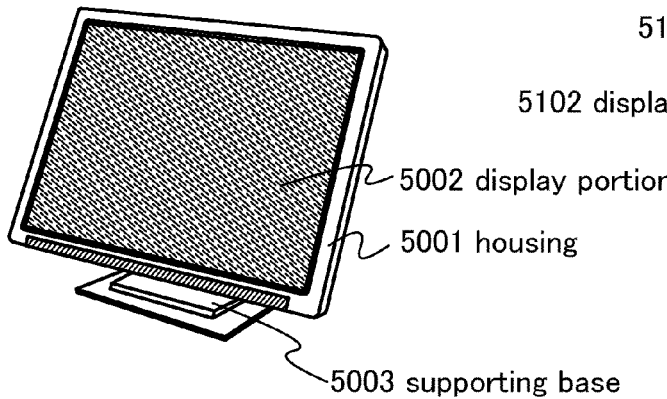
FIGS. 18A to 18E are diagrams illustrating electronic devices.

FIG. 18A illustrates a display device including a housing 5001, a display portion 5002, a supporting base 5003, and the like. The semiconductor display device according to one embodiment of the present invention can be used for the display portion 5002. The use of the semiconductor display device according to one embodiment of the present invention for the display portion 5002 can provide a display device capable of obtaining high-resolution, high-quality image data and being equipped with more highly functional applications. The use of the semiconductor display device according to one embodiment of the present invention for the display portion 5002 can reduce power consumption of the display device. Note that the display device includes all devices for displaying information such as for a personal computer, for receiving TV broadcasting, and for displaying an advertisement.

Figure 18B:
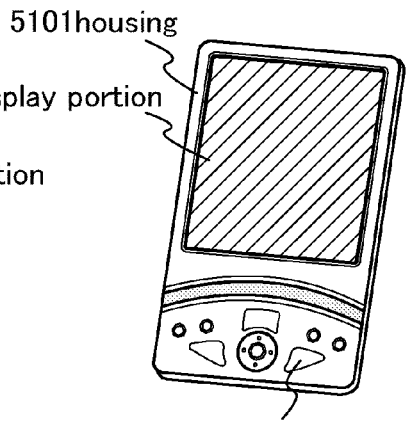

FIG. 18B illustrates a portable information terminal including a housing 5101, a display portion 5102, operation keys 5103, and the like. The semiconductor display device according to one embodiment of the present invention can be used for the display portion 5102. The use of the semiconductor display device according to one embodiment of the present invention for the display portion 5102 can provide a portable information terminal capable of obtaining high-resolution, high-quality image data and being equipped with more highly functional applications. The use of the semiconductor display device according to one embodiment of the present invention for the display portion 5102 can reduce power consumption of the portable information terminal.

Figure 18C:
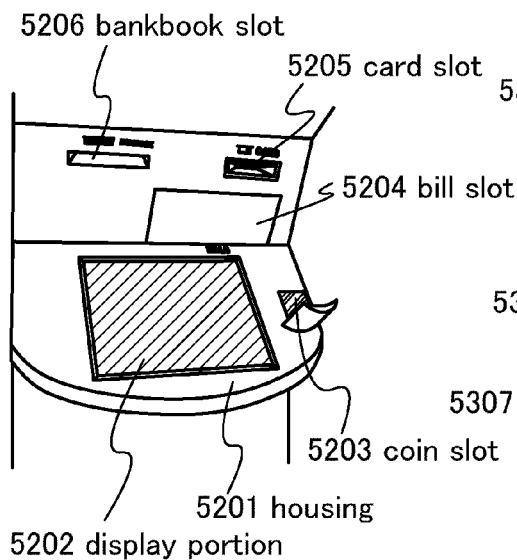

FIG. 18C illustrates an automated teller machine including a housing 5201, a display portion 5202, a coin slot 5203, a bill slot 5204, a card slot 5205, a bankbook slot 5206, and the like. The semiconductor display device according to one embodiment of the present invention can be used for the display portion 5202. The use of the semiconductor display device according to one embodiment of the present invention for the display portion 5202 can provide an automated teller machine capable of obtaining high-resolution, high-quality image data and being equipped with more highly functional applications. The use of the semiconductor display device according to one embodiment of the present invention for the display portion 5202 can reduce power consumption of the automated teller machine. The automated teller machine including the semiconductor display device according to one embodiment of the present invention can read biometric information such as a finger print, a face, a handprint, a palm print, a pattern of a hand vein, an iris, and the like which are used for biometric authentication with higher accuracy. Therefore, a false non-match rate which is the rate at which a person who should be authenticated is recognized as a different person and a false acceptance rate which is the rate at which a different person is authenticated as a person who should be authenticated can be suppressed in biometric authentication.

Figure 18D:
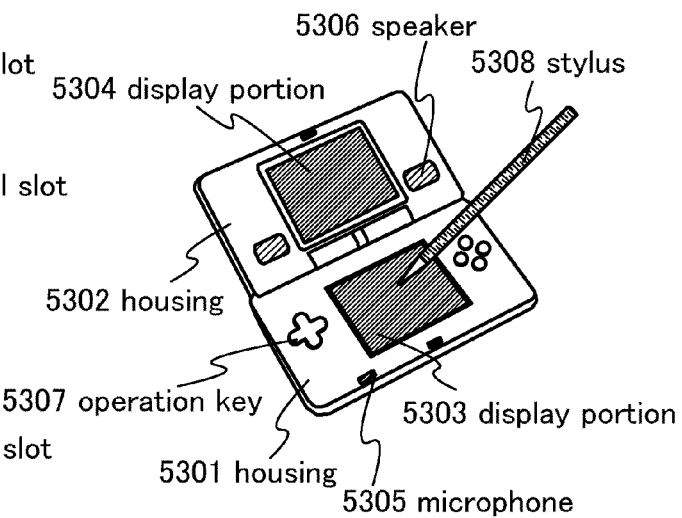

FIG. 18D illustrates a portable game machine including a housing 5301, a housing 5302, a display portion 5303, a display portion 5304, a microphone 5305, a speaker 5306, an operation key 5307, a stylus 5308, and the like. The semiconductor display device according to one embodiment of the present invention can be used for the display portion 5303 or the display portion 5304. The use of the semiconductor display device according to one embodiment of the present invention for the display portion 5303 or the display portion 5304 can provide a portable game machine capable of obtaining high-resolution, high-quality image data and being equipped with more highly functional applications. The use of the semiconductor display device according to one embodiment of the present invention for the display portion 5303 or the display portion 5304 can reduce power consumption of the portable game machine. Note that although the portable game machine illustrated in FIG. 18D includes the two display portions 5303 and 5304, the number of display portions included in the portable game machine is not limited to two.

Figure 18E:

FIG. 18E illustrates a mobile phone including a housing 5401, a display portion 5402, an audio input portion 5403, an audio output portion 5404, operation keys 5405, a light-receiving portion 5406, and the like. Light received by the light-receiving portion 5406 is converted into electrical signals, whereby external images can be loaded. The semiconductor display device according to one embodiment of the present invention can be used for the display portion 5402. The use of the semiconductor display device according to one embodiment of the present invention for the display portion 5402 can provide a mobile phone capable of obtaining high-resolution, high-quality image data and being equipped with more highly functional applications. The use of the semiconductor display device according to one embodiment of the present invention for the display portion 5402 can reduce power consumption of the mobile phone. The solid-state imaging device according to one embodiment of the present invention can be used to convert light received by the light-receiving portion 5406 into electrical signals. The use of the solid-state imaging device according to one embodiment of the present invention can provide a mobile phone capable of obtaining high-resolution, high-quality image data and being equipped with more highly functional applications. The use of the solid-state imaging device according to one embodiment of the present invention can reduce power consumption of the mobile phone.

This example can be implemented in combination with any of the above-described embodiments and example.

This application is based on Japanese Patent Application serial no. 2010-150844 filed with Japan Patent Office on Jul. 1, 2010, the entire contents of which are hereby incorporated by reference.

What is claimed is:

1. A solid-state imaging device comprising:
   a plurality of pixels, each of the plurality of pixels comprising:
   a photodiode configured to generate current; and
   an amplifier circuit configured to amplify an amount of charge determined by a value of current, thereby generating an output signal,
   wherein the amplifier circuit comprises a first transistor and a second transistor which are configured to hold the amount of charge determined by the value of current,
   wherein one of a source and a drain of the first transistor is connected to the photodiode,
   wherein the other of the source and the drain of the first transistor is electrically connected to a gate of the second transistor,
   wherein the plurality of pixels comprise a first plurality of pixels connected to a first wiring supplied with a first output signal, and a second plurality of pixels connected to a second wiring supplied with a second output signal,
   wherein the value of current is determined by an intensity of irradiation light,
   wherein a third wiring for supplying a potential to switch the first transistor included in each of the first plurality of pixels for controlling accumulation of first charge is connected to a fourth wiring for supplying the potential to the second plurality of pixels, and
   wherein the third wiring is electrically connected to the first transistor in each of the first plurality of pixels.

2. The solid-state imaging device according to claim 1, wherein the first transistor comprises, in a channel formation region, a semiconductor material having a wider band gap than silicon and having a lower intrinsic carrier density than silicon.

3. The solid-state imaging device according to claim 2, wherein the semiconductor material is an oxide semiconductor.

4. The solid-state imaging device according to claim 3, wherein the oxide semiconductor is an In—Ga—Zn-based oxide semiconductor.

5. The solid-state imaging device according to claim 3, wherein a hydrogen concentration of the channel formation region is $5 \times 10^{19}/cm^3$ or less.

6. The solid-state imaging device according to claim 1, wherein an off-state current density of the first transistor is 100 yA/μm or less.

7. The solid-state imaging device according to claim 1, wherein the third wiring is connected to a gate of the first transistor in each of the first plurality of pixels.

8. A solid-state imaging device comprising:
- a plurality of pixels, each of the plurality of pixels comprising:
- a photodiode configured to generate current; and
- an amplifier circuit configured to amplify an amount of charge determined by a value of current, thereby generating an output signal,
- wherein the amplifier circuit comprises a first transistor and a second transistor which are configured to hold the amount of charge determined by the value of current,
- wherein one of a source and a drain of the first transistor is connected to the photodiode,
- wherein the other of the source and the drain of the first transistor is electrically connected to a gate of the second transistor,
- wherein the plurality of pixels comprise a first plurality of pixels connected to a first wiring supplied with a first output signal, and a second plurality of pixels connected to a second wiring supplied with a second output signal,
- wherein the value of current is determined by an intensity of irradiation light,
- wherein a third wiring connected to an anode of a first photodiode included in the first plurality of pixels is connected to a fourth wiring connected to an anode of a second photodiode included in the second plurality of pixels,
- wherein a fifth wiring for supplying a potential to switch the first transistor included in each of the first plurality of pixels is connected to a sixth wiring for supplying the potential to the second plurality of pixels, and
- wherein the fifth wiring is electrically connected to the first transistor in each of the first plurality of pixels.

9. The solid-state imaging device according to claim 8, wherein the first transistor comprises, in a channel formation region, a semiconductor material having a wider band gap than silicon and having a lower intrinsic carrier density than silicon.

10. The solid-state imaging device according to claim 9, wherein the semiconductor material is an oxide semiconductor.

11. The solid-state imaging device according to claim 10, wherein the oxide semiconductor is an In—Ga—Zn-based oxide semiconductor.

12. The solid-state imaging device according to claim 10, wherein a hydrogen concentration of the channel formation region is $5 \times 10^{19}/cm^3$ or less.

13. The solid-state imaging device according to claim 8, wherein an off-state current density of the first transistor is 100 yA/μm or less.

14. A solid-state imaging device comprising:
- a plurality of pixels, each of the plurality of pixels comprising:
- a photodiode configured to generate current; and
- an amplifier circuit configured to amplify an amount of charge determined by a value of current, thereby generating an output signal,
- wherein the amplifier circuit comprises a first transistor and a second transistor which are configured to hold the amount of charge determined by the value of current,
- wherein one of a source and a drain of the first transistor is connected to the photodiode,
- wherein the other of the source and the drain of the first transistor is electrically connected to a gate of the second transistor,
- wherein the plurality of pixels comprise a first plurality of pixels connected to a first wiring supplied with a first output signal, and a second plurality of pixels connected to a second wiring supplied with a second output signal,
- wherein the value of current is determined by an intensity of irradiation light,
- wherein a third wiring supplied with a first signal for controlling switching of a third transistor included in the first plurality of pixels is connected to a fourth wiring supplied with a second signal for controlling switching of a fourth transistor included in the second plurality of pixels,
- wherein a fifth wiring supplied with a third signal for controlling switching of the first transistor included in each of the first plurality of pixels is connected to a sixth wiring for supplying a fourth signal to the second plurality of pixels, and
- wherein the fifth wiring is electrically connected to the first transistor in each of the first plurality of pixels.

15. The solid-state imaging device according to claim 14, wherein the first transistor comprises, in a channel formation region, a semiconductor material having a wider band gap than silicon and having a lower intrinsic carrier density than silicon.

16. The solid-state imaging device according to claim 15, wherein the semiconductor material is an oxide semiconductor.

17. The solid-state imaging device according to claim 16, wherein the oxide semiconductor is an In—Ga—Zn-based oxide semiconductor.

18. The solid-state imaging device according to claim 16, wherein a hydrogen concentration of the channel formation region is $5 \times 10^{19}/cm^3$ or less.

19. The solid-state imaging device according to claim 14, wherein an off-state current density of the first transistor is 100 yA/μm or less.

* * * * *